United States Patent [19]
Goudie et al.

[11] Patent Number: 5,899,216
[45] Date of Patent: May 4, 1999

[54] APPARATUS FOR RINSING WAFERS IN THE CONTEXT OF A COMBINED CLEANING RINSING AND DRYING SYSTEM

[75] Inventors: Chad Goudie, Chandler, Ariz.; John Natalicio, Los Angelos, Calif.; Greg Olsen, Tempe, Ariz.; Eric Shurtliff, Phoenix, Ariz.

[73] Assignee: Speedfam Corporation, Chandler, Ariz.

[21] Appl. No.: 08/855,208

[22] Filed: May 13, 1997

Related U.S. Application Data

[63] Continuation-in-part of application No. 08/676,546, Jul. 8, 1996.

[51] Int. Cl.$^6$ .................................................. B08B 3/02
[52] U.S. Cl. .......................... 134/61; 134/134; 134/151; 134/199; 134/902
[58] Field of Search ............... 134/61, 79, 80, 134/82, 133, 134, 151, 153, 199, 902

[56] References Cited

U.S. PATENT DOCUMENTS

| | | | |
|---|---|---|---|
| 1,691,839 | 11/1928 | Caskin | 134/151 X |
| 3,494,815 | 2/1970 | Yoshimatsu | 134/153 X |
| 4,561,144 | 12/1985 | Marais | 134/133 X |
| 4,805,348 | 2/1989 | Arai et al. | 51/118 |
| 4,960,140 | 10/1990 | Ishijima et al. | 134/199 X |
| 5,099,614 | 3/1992 | Arai et al. | 51/165 |
| 5,187,831 | 2/1993 | Franch | 134/151 X |
| 5,203,360 | 4/1993 | Nguyen et al. | |
| 5,213,451 | 5/1993 | Frank | 406/72 |
| 5,329,732 | 7/1994 | Kalsrud et al. | 51/131.5 |
| 5,357,645 | 10/1994 | Onodera | 15/97.1 |
| 5,442,828 | 8/1995 | Lutz | 15/88.3 |
| 5,483,984 | 1/1996 | Donlan, Jr. et al. | 134/199 X |
| 5,498,196 | 3/1996 | Kalsrud et al. | 451/11 |
| 5,498,199 | 3/1996 | Karlsrud et al. | 451/289 |

FOREIGN PATENT DOCUMENTS

| | | |
|---|---|---|
| 0 412 796 A3 | 2/1991 | European Pat. Off. . |
| 0 795 892 A1 | 9/1997 | European Pat. Off. . |
| 02 250 324 | 10/1990 | Japan . |
| 99145 | 4/1994 | Japan ..................................... 134/151 |

OTHER PUBLICATIONS

Patent Abstracts of Japan, vol. 14, No. 576 (E–1016), Dec. 21, 1990 & JP 02 250324 (Hitachi), Oct. 8, 1990 (see abstract).

Carufe: "wafer precleaning" IBM Technical Disclosure Bulletin, vol. 17, No. 2, Jul. 2, 1974, New York, US, p. 427 XP002045902 (see the whole document).

*Primary Examiner*—Philip R. Coe
*Attorney, Agent, or Firm*—Snell & Wilmer

[57] ABSTRACT

The present invention relates to a wafer cleaning machine having an input station, a water track, a cleaning station, a rinsing station, a spin-dry station, and a load station. The input station includes two or more wafer supply areas for a continuous supply of wafers to the water track. After the wafers enter the water track from the input station, the wafers are transported down the track into the wafer cleaning station. The wafer cleaning station comprises a plurality of pairs of rollers which pull the wafers through the cleaning station and thereby clean the top and bottom flat surfaces of the wafers. A one-piece cleaning fluid manifold formed within the upper panel of the cleaning station facilitates effective distribution of the cleaning fluid to the rollers. From the cleaning station, the wafers are transported to a rinse station. From the rinsing station, the workpieces are transferred to a dual spin-dry station. A manipulator assembly is configured to cooperate with the rinse station to lift and transport the rinsed wafers from the rinse station to the two spin-dry assemblies. At the spin-dry station, the workpieces are spun at a high speed to remove any residual water droplets or the like. The spin-dry assemblies include a water/debris shield that rises during the spin-dry process. From the dual spin-dry station, a robotic transfer arm removes the work pieces from the spin-dry station and places them in one of a pair of unload cassettes. After the cassettes are filled with wafers, they are removed and transferred for subsequent processing.

19 Claims, 17 Drawing Sheets

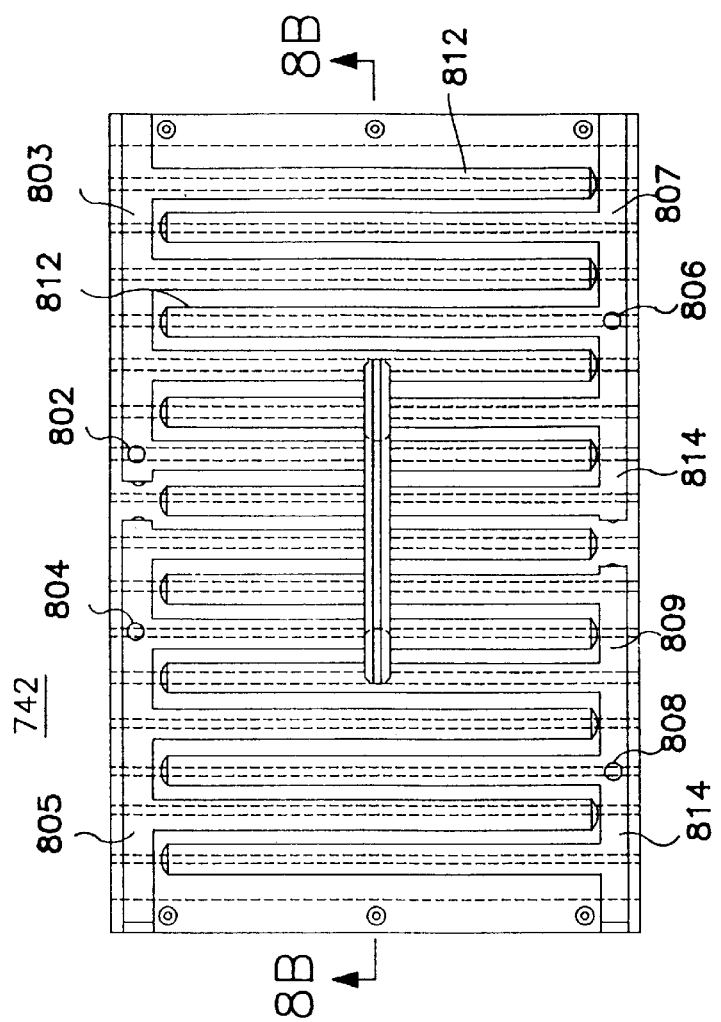
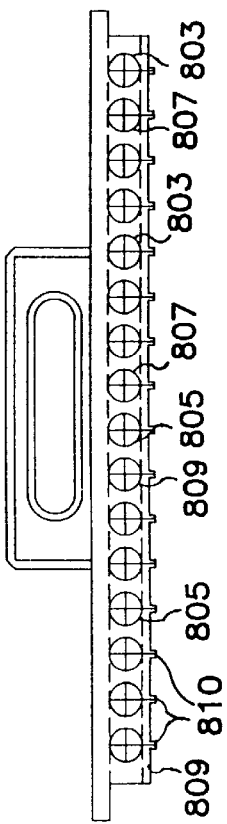
FIG. 8A
FIG. 8B
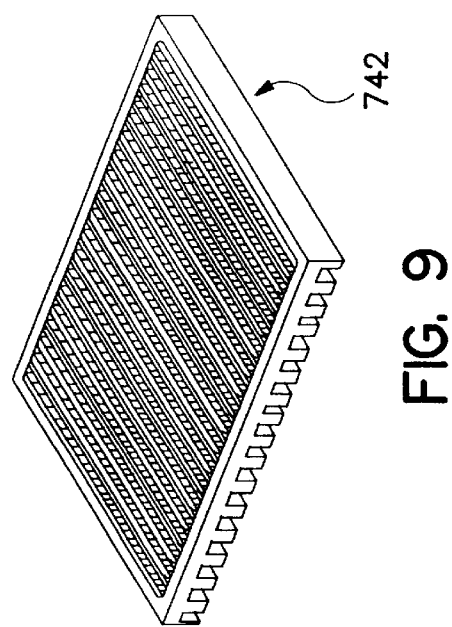
FIG. 9

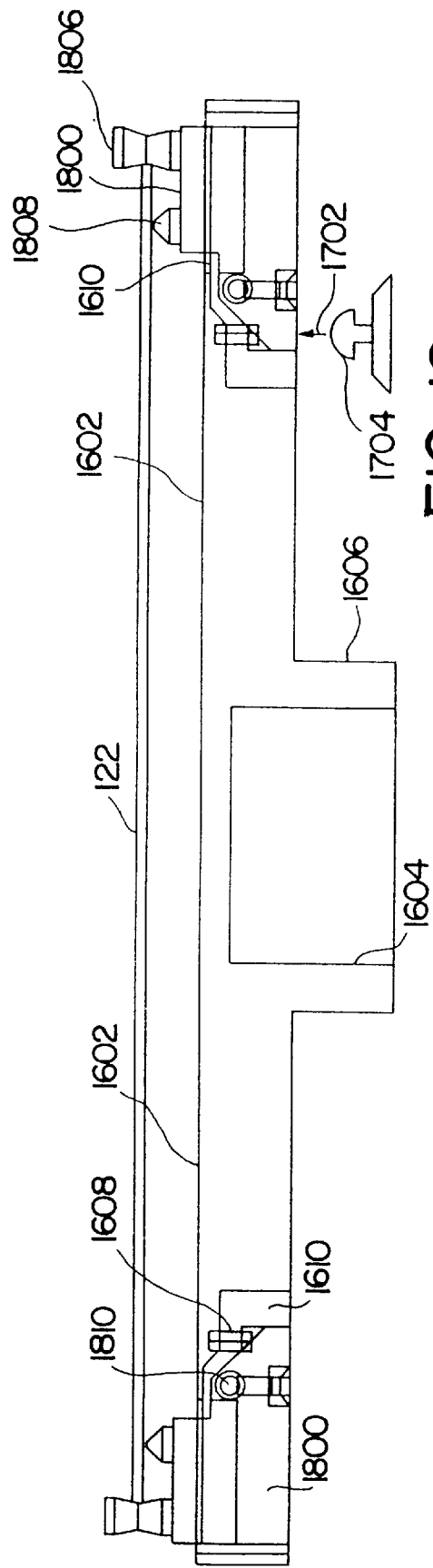
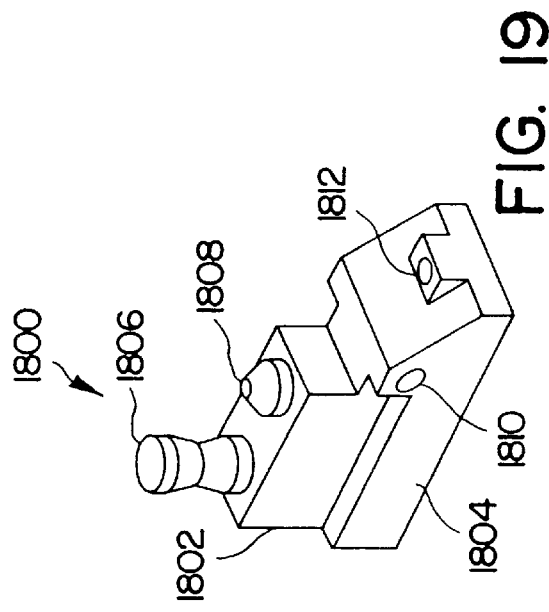
FIG. 18
FIG. 19

APPARATUS FOR RINSING WAFERS IN THE CONTEXT OF A COMBINED CLEANING RINSING AND DRYING SYSTEM

RELATED APPLICATION

This application is a Continuation-In-Part of United States patent application Ser. No. 08/676,546, filed Jul. 8, 1996 pending.

TECHNICAL FIELD

The present invention relates, generally, to a self-contained machine for cleaning, rinsing, and spin-drying semiconductor wafer workpieces and, more particularly, to an improved system having a dual input, single water track input mechanism and improved rinse and spin-dry assemblies.

BACKGROUND ART AND TECHNICAL PROBLEMS

Machines for cleaning wafers and disks in the electronics industry are generally well known. For example, semiconductor wafers, magnetic disks, and other workpieces often come in the form of flat, substantially planar, circular disks. In the manufacture of integrated circuits, semiconductor wafer disks are sliced from a silicon ingot and prepared for further processing. After each wafer is sliced from the ingot, it must be thoroughly cleaned, rinsed, and dried to remove debris from the surface of the wafer. Thereafter, a series of steps are performed on the wafer to build the integrated circuits on the wafer surface, including applying a layer of microelectronic structures and thereafter applying a dielectric layer. Often, the disks must be planarized upon the application of the dielectric layer. For a discussion of chemical mechanical planarization (CMP) processes and apparatus, see, for example, Arai, et al., U.S. Pat. No. 5,099,614, issued March, 1992; Karlsrud, U.S. Pat. No. 5,498,196, issued March, 1996; Arai, et al., U.S. Pat. No. 4,805,348, issued February, 1989; Karlsrud et al., U.S. Pat. No. 5,329,732, issued July, 1994; and Karlsrud et al., U.S. Pat. No. 5,498,199, issued March, 1996.

After each processing step, it is often desirable to thoroughly clean, rinse, and dry the workpiece to ensure that debris is removed from the workpiece. Thus, methods and apparatus for quickly and efficiently cleaning, rinsing, and drying wafers are needed which facilitate high workpiece throughput, while at the same time thoroughly cleaning and drying the wafers with a minimum of wafer breakage. For a discussion of existing wafer cleaning machines, see, for example, Lutz, U.S. Pat. No. 5,442,828, issued Aug. 22, 1995; Frank et al., U.S. Pat. No. 5,213,451, issued May 25, 1993; and Onodera, U.S. Pat. No. 5,357,645, issued Oct. 25, 1994.

Presently known wafer cleaning machines are unsatisfactory in several regards. For example, as the demand increases for semiconductor products, and in particular integrated circuit devices, the need for higher throughput wafer cleaning machines has correspondingly increased. However, the single input configuration of presently known wafer cleaning machines continues to impede throughput.

In addition, the pressure on wafer cleaning machine manufacturers to increase throughput has driven many manufacturers to design machines with high rotational spin rates (e.g., 1,800–2,200 RPM) to spin-dry the wafers very quickly. In so doing, the industry is currently experiencing an unacceptably high level of wafer breakage in the spin-dry operation. This breakage can be quite costly, particularly for wafers which comprise integrated circuits in the latter stages of processing.

A wafer cleaning machine is thus needed which overcomes the shortcomings of the prior art.

SUMMARY OF THE INVENTION

In accordance with the present invention, a rinsing station for rinsing wafers is provided which overcomes many of the shortcomings of the prior art.

In accordance with a combined system for cleaning, rinsing, and drying wafers, a single water track is employed to serially introduce wafers into a wafer cleaning station. In order to increase throughput and permit the subject wafer cleaning machine to operate substantially continuously, two or more wafer input stations are configured to supply wafers to the single water track. In this way, as one cassette of wafers is being discharged from a first cassette load station into the water track for further processing, the operator may load a full cassette of wafers into a second cassette load station. When the first load station has ejected all of the wafers from the cassette, a cassette-present sensor in the second load station senses the presence of the second fully loaded cassette, and begins feeding wafers from the second load station into the water track in a substantially uninterrupted sequence. While the second wafer cassette load station is supplying wafers to the water track, the operator may load a new cassette full of wafers to be cleaned into the first cassette load station; alternatively, the loading of full cassettes into the respective load stations may be performed in an automated fashion without the need for a human operator.

In accordance with a further aspect of the combined system, the single water track feeds the wafers into a single cleaning station wherein both surfaces of each wafer are washed and cleaned. In accordance with a particularly preferred embodiment, the wafer cleaning station comprises a plurality of pairs of rollers; the rollers pull the wafers through the cleaning station and thereby clean the top and bottom flat surfaces of the wafers. More particularly, various of the rollers within the roller box operate at different rotational speeds. In this way, certain of the rollers may function as drive rollers to move the wafer through the cleaning station, while other rollers may operate at different rotational speeds to thereby clean the surfaces of the wafers as they are driven through the cleaning station.

In a particularly preferred embodiment of the combined system, the various rollers in the cleaning station are all contained in an enclosed box which may be easily removed from the machine to facilitate the convenient changing of the rollers as the roller surfaces become worn through extended use. In accordance with a further aspect of a preferred embodiment of the invention, a plurality of channels are configured in an upper inside surface of the roller box to permit the distribution of a plurality of different chemicals (e.g., water, cleaning solution, surfactants, friction reducing agents, and agents to control the pH of the various solutions) into discrete regions of the roller box. In this way, a workpiece passing through a first set of rollers may be exposed to a first chemical solution, whereupon the same wafer may be subsequently exposed to a second chemical solution in a latter stage of the roller box.

In accordance with a further aspect of the present invention, the roller box is configured to output disks into a rinse station. Workpieces are rinsed in a serial manner within the rinse station, which is configured to tilt downward during the rinsing procedure. The downward tilt facilitates effective drainage and removal of any debris or chemicals. A number of water jets urge each workpiece into the rinse station, maintain the position of the workpiece during rinsing, and perform the rinsing of the upper and lower surfaces of the workpiece. The water jets also support the workpiece within the rinse station such that mechanical contact with the workpiece is minimized.

In accordance with a further aspect of the present invention, upon being retrieved from the rinse station the workpieces are transferred to a dual spin-dry station. A manipulator assembly lifts the rinsed workpieces from the rinse station and transfers the workpieces to one of the spin-dry stations. The timing of the manipulator is controlled to optimize throughput; the manipulator may transport one rinsed workpiece while another workpiece is being rinsed. The use of the manipulator reduces the amount of moving parts within the machine, and simplifies the control and timing processes.

In accordance with a particularly preferred embodiment, each spin-dry station is equipped with a spin motor which is tuned to the particular type of workpieces being spun. More particularly, a spin-dry station may be tuned by placing a dummy workpiece on the spinner, and allowing the spinner motor to self-tune to the operating environment, including spin speeds in the range of 4,000 rpm, to thereby substantially eliminate harmonics, vibrations, and the like due to the spinner motor through the use of self-adjustment programs resident in the motor. By eliminating harmonics, vibrations, and the like imparted to the system by the motor, very high spin speeds may be employed while minimizing workpiece breakage.

Each spin-dry station may include a shield that rises to guard against water and debris that may be shed during the spin-dry process. The use of an articulating shield enables the machine to operate in a relatively "open" manner without having to employ complex enclosures, sealing doors, and additional moving parts. Furthermore, each spin-dry station may employ a number of clamps configured to maintain the workpiece upon the platform during the spin-dry process. The position and configuration of the clamps may be compatible with a number of differently shaped workpieces.

In accordance with a further aspect of the combined system, a pair of unload cassettes are employed, each being configured to receive workpieces from both spin-dry stations. Thus, as one unload cassette becomes filled with clean, dry wafers, the machine may be configured to begin filling a second unload cassette with clean, dry workpieces. As the second unload cassette is being filled, the first unload cassette may be removed (manually or automatically) from the machine to thereby permit substantially continuous, uninterrupted operation of the subject wafer cleaning machine.

In accordance with a further aspect of the combined system, the flow of fluids to the wafer load station, water track, cleaning station, and rinse stations are suitably controlled through the use of a fluid flow regulator system, which monitors the flow of fluid, as opposed to prior art systems which typically measure fluid pressure. By measuring fluid flow directly, the system is less susceptible to variations in inlet fluid pressure. Fluid flows within the system may thus be much more accurately controlled than is possible with prior art systems.

In accordance with a further aspect of the combined system, an operator interface suitably comprises a flat panel touch screen. The touch screen is advantageously configured to present the operator with a three-dimensional graphical image of virtually every relevant aspect of the system to facilitate operation, maintenance, trouble-shooting, and the like.

BRIEF DESCRIPTION OF THE DRAWING FIGURES

The present invention will hereinafter be described in conjunction with the appended drawing figures, wherein like numerals generally denote like elements, and:

FIG. 8A is a top plan schematic view of the top panel of the roller box shown in FIG. 7A;

FIG. 8B is a cross sectional top view of the top panel shown in FIG. 8A as viewed along line 8B—8B;

FIG. 9 is a perspective view of the top panel shown in FIG. 8A;

FIG. 18 is a side sectional view of an exemplary spin platform, with a bob shown attached to the distal end of each arm of the spin platform;

FIG. 19 is a perspective close-up view of an exemplary spinner bob in accordance with a preferred embodiment of the present invention;

DETAILED DESCRIPTION OF PREFERRED EXEMPLARY EMBODIMENTS

Figure 1:
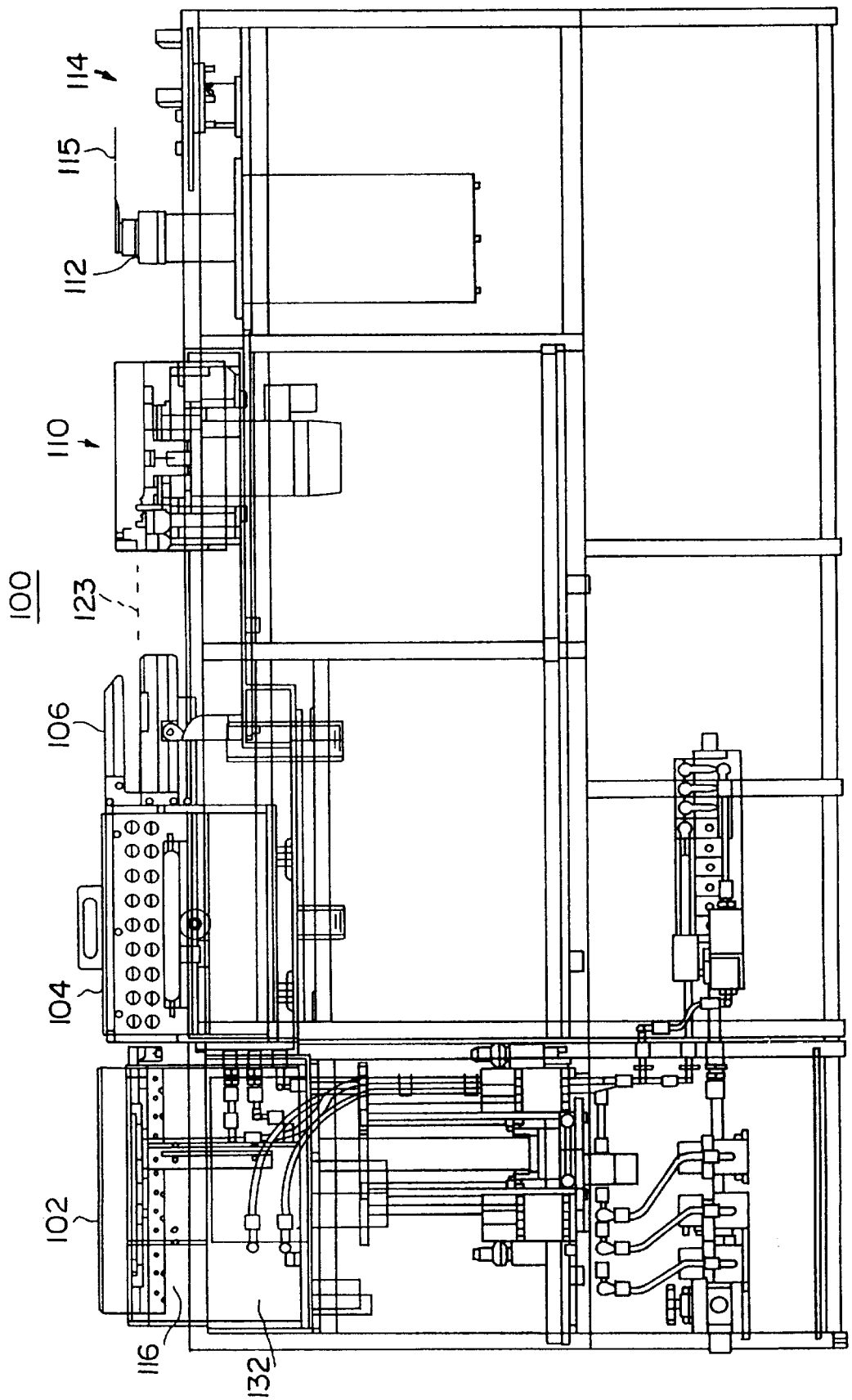
FIG. 1 is a detailed front view of a preferred exemplary embodiment of an integrated machine for washing, rinsing, spin-drying, and unloading workpieces.
Figure 2:
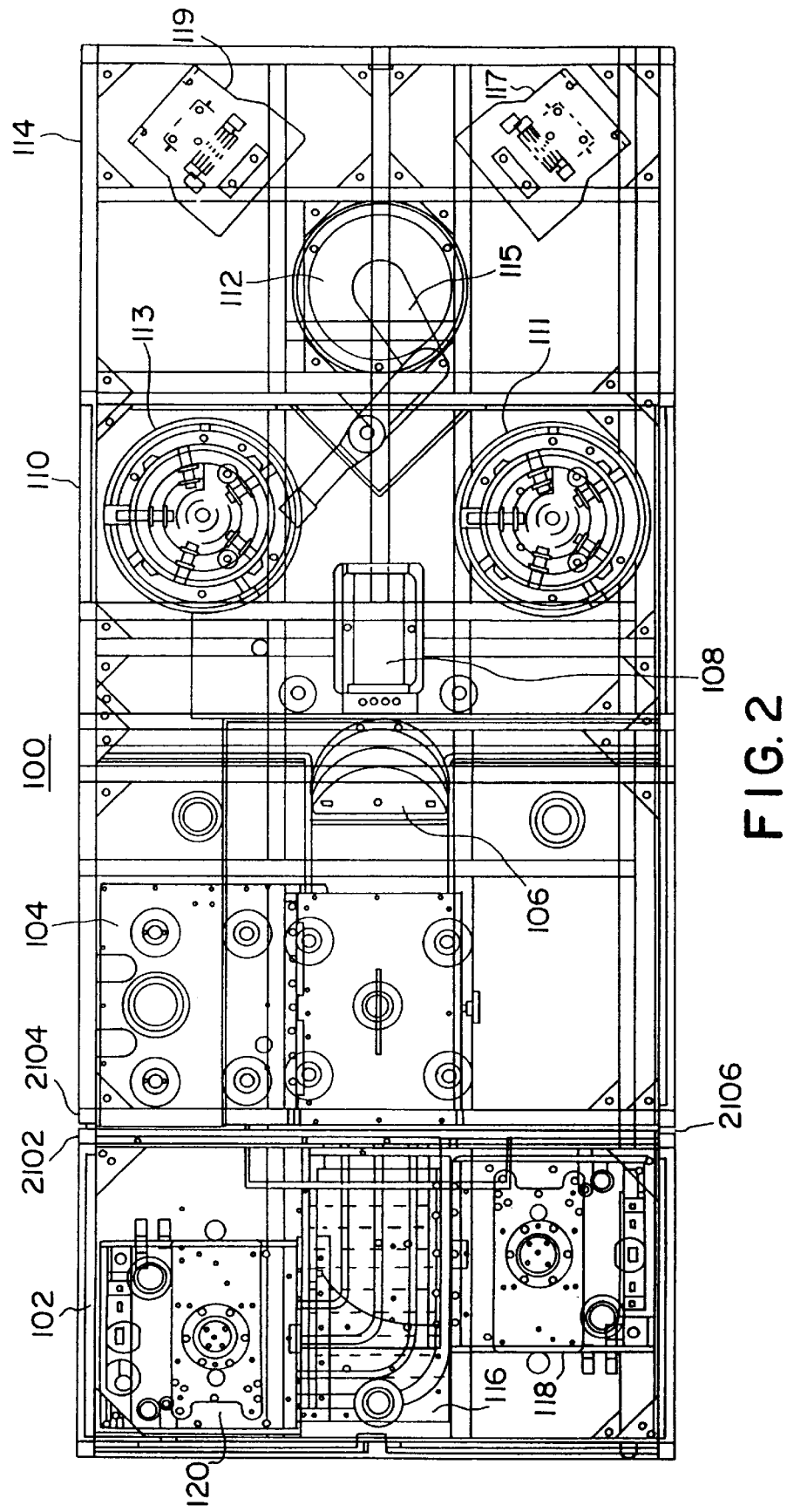
FIG. 2 is a top schematic plan view of the machine shown in FIG. 1.

Referring now to FIGS. 1 and 2, an exemplary embodiment of a wafer cleaning machine 100 suitably includes a wafer load station 102, a water track transport assembly 116, a cleaning station 104, a rinse station 106, a manipulator 108 (not shown in FIG. 1), a spin-dry station 110, and a wafer unload station 114. Each of the foregoing stations are structurally and functionally described in greater detail below.

With continued reference to FIGS. 1 and 2, in accordance with one aspect of the present invention, wafer load station 102 is suitably configured to accommodate at least two wafer cassettes to permit the substantially continuous operation of machine 100. That is, a first wafer load assembly 118 (see FIG. 2) is configured to receive a cassette full of wafers to be cleaned. In this regard, although the present invention is described in the context of exemplary workpieces such as semiconductor wafers, virtually any substantially flat, substantially circular workpieces may suitably be employed in the context of the present invention.

As individual workpieces are individually discharged from first load assembly 118, the operator may install a second cassette filled (partially or fully) with workpieces to be cleaned in a second wafer load assembly 120. In this way, when all of the workpieces from first load assembly 118 have been serially discharged into water track 116, the wafers resident in second load assembly 120 may immediately thereafter begin being output into water track 116. While the wafers are being discharged from second load assembly 120, the operator may install a new cassette of wafers to be cleaned within first load assembly 118. Accordingly, substantially continuous, uninterrupted input of wafers into machine 100 may be achieved, facilitating substantially higher workpiece throughput than previously achievable with presently known wafer cleaning machines.

For a more detailed discussion of wafer cassettes and cassettes useful in the context of machine 100, see, for example, U.S. patent application Ser. No. 08/671,155, entitled "Adjustable Wafer Cassette Stand", filed Jun. 28, 1996, in the name of Erich Edlinger, the entire contents of which are hereby incorporated into this application by this reference.

With continued reference to FIGS. 1 and 2, although respective first and second load assemblies 118, 120 are shown in a substantially "T-shaped" configuration, it will be understood that any suitable configuration may be employed to conveniently discharge workpieces from the cassettes into water track 116. For example, a "Y" configuration, or a modified "T" configuration in which the workpieces are not directed toward the opposing cassette assembly may be employed in the context of the present invention, as described in greater detail below.

Each load assembly 118, 120 suitably includes a platform which supports a cassette filled with workpieces. For the sake of clarity, these and other elements of load assemblies 118 and 120, which may be known to those skilled in the art, are not shown or described in detail herein. An elevator assembly, for example a servo assembly, stepper motor, torque motor assembly, or the like, is suitably configured to raise the platform to a level approximately defined by the upper surface of water track assembly 116 (see FIG. 1). It should be appreciated that cassettes that are either partially or fully filled with workpieces may be loaded into the machine.

In the context of many workpiece cleaning processes, it is desirable to maintain the workpieces in a wet environment prior to being processed by machine 100. Thus, in accordance with one aspect of the present invention, each load assembly 118, 120 further comprises a tank or chamber 132 (see FIG. 1) which may be suitably filled with a desired fluid, for example, deionized water, which may include surfactants, cleaning agents, pH controlling agents, and the like. The elevator assembly is suitably configured to extend into tank 132 to thereby control the vertical position of the cassette within tank 132.

The manner in which wafers are individually discharged from a cassette will now be described in the context of a preferred embodiment of the invention.

Figure 3:
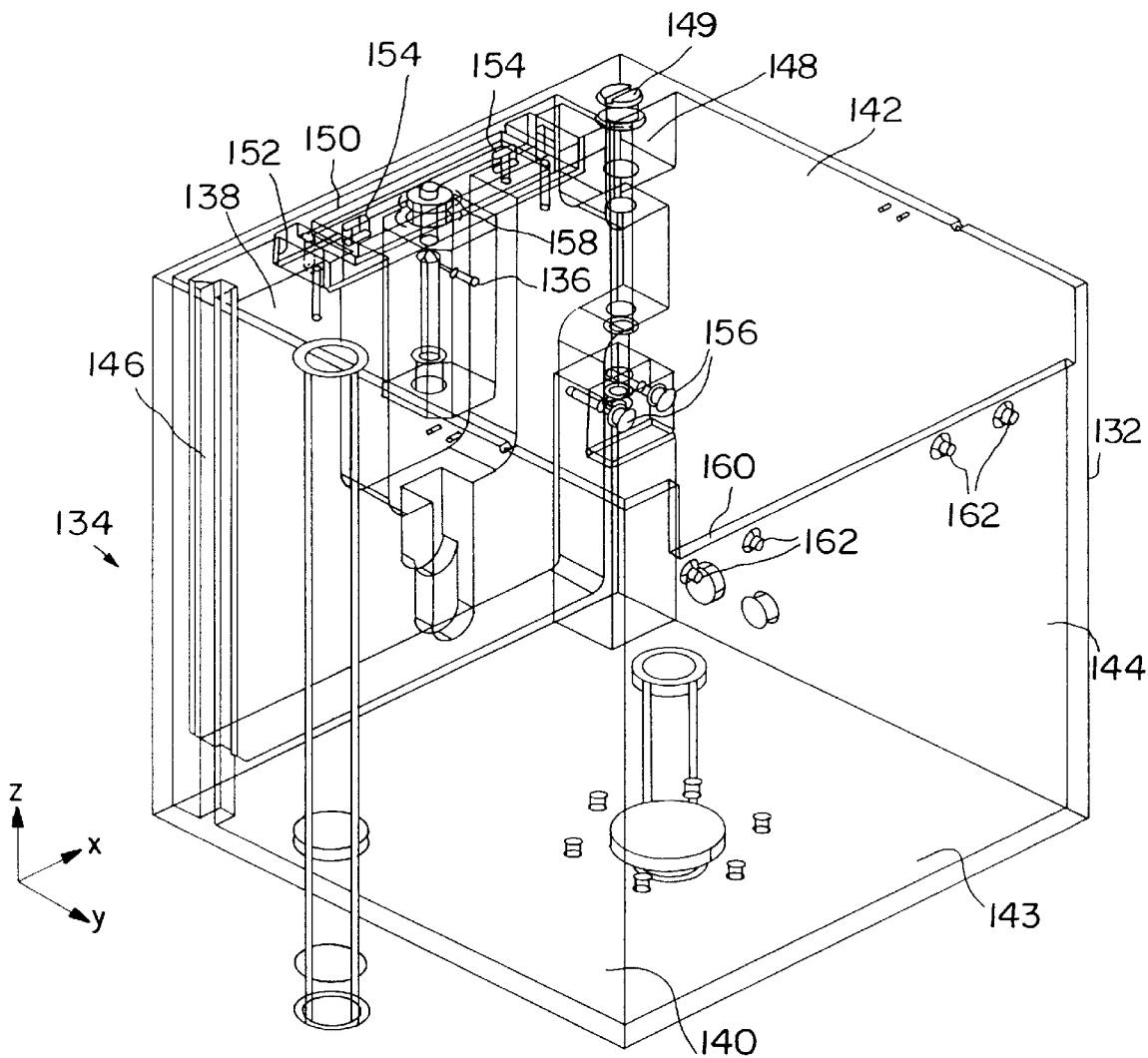
FIG. 3 is a schematic perspective view of an exemplary discharge mechanism for urging workpieces from the cassettes shown in FIG. 1.

Referring now to FIGS. 1–3, a wafer discharge assembly 134 suitably comprises soak tank 132 configured to maintain the cassette immersed in fluid. Workpiece discharge assembly 134 further comprises a nozzle 136 configured to forcibly discharge a fluid stream toward the edge of the top workpiece within a cassette to discharge the workpiece from the cassette. In the context of the present invention, although the term "fluid" refers to a liquid in the preferred embodiment, it will be understood that the term "fluid" may also refer to a gas for those applications of machine 100 in which a gas is used to eject the wafers, for example when it is not necessary to maintain the workpieces in the wetted condition.

With continued reference to FIG. 3, workpiece discharge assembly 134 is suitably configured to facilitate virtually any desired orientation of nozzle 136 with respect to the workpiece to be discharged.

More particularly, discharge assembly 134 further comprises a back plate 138, respective side plates 140, 142, a bottom plate 143, and a front plate 144. As best seen in FIG. 3, back plate 138 is suitably configured to slide up and down (along the Z axis) through a slotted engagement mechanism 146 with side plate 140. A Z axis control assembly 148 suitably secures the vertical position of back plate 138 with respect to discharge assembly 134. In this way, the vertical position of nozzle 136 with respect to the uppermost workpiece in the cassette may be adjusted and maintained. For this purpose, Z axis control assembly 148 suitably comprises a screw 149 to secure the Z position of nozzle 136.

With continued reference to FIG. 3, the X axis position of nozzle 136 may be adjusted and maintained by sliding a nozzle support block 150 along the X axis within a rectangular relief 152 formed in rear plate 138. The X position of block 150 (and hence the X position of nozzle 136) may be maintained by securing a pair of screws (not shown) within respective oval adjustment recesses 154 of block 150.

With continued reference to FIG. 3, the position of nozzle 136 with respect to the workpiece to be discharged may be further adjusted by tilting the Z axis by manipulating respective tilt screws 156. In this way, back plate 138, corresponding to the Z-X plane, may be tilted about the X axis, as desired. Finally, a radial adjustment mechanism 158 may be manipulated to effectively rotate nozzle 136 about the Z axis.

By adjusting the position of nozzle 136 with respect to the workpiece to be discharged in accordance with the aforementioned adjustment mechanisms, optimum placement of nozzle 136 with respect to the workpiece may be achieved. With continued reference to FIG. 3, front plate 144 of discharge assembly 134 suitably comprises a wafer discharge outlet 160 through which workpieces are discharged from discharge assembly 134 and into water track 116, as described in greater detail below. As further described below, front panel 144 is suitably secured to water track assembly 116 through respective water track mounts 162.

With continued reference to FIGS. 1 and 3, it will be appreciated that the elevator assembly is suitably configured to raise the platform (and hence the cassette) upwardly along the Z axis in step-wise fashion within tank 132 to thereby properly position the uppermost wafer proximate the cassette adjacent nozzle 136 so that the fluid discharged from nozzle 136 sequentially urges the then uppermost workpiece through wafer outlet passage 160 and into water track 116, as described in greater detail below.

In an exemplary embodiment of the present invention, the amount of water pressure available to machine 100 may be limited due to any number of application-specific factors. For this reason, nozzle 136 is preferably configured to increase the force of the discharged water such that an adequate and reliable discharging force is applied to the workpieces. In a preferred embodiment, nozzle 136 exhibits a reduction in cross sectional area in a longitudinal manner from its inlet to its outlet. In other words, nozzle 136 is preferably narrower at the discharge end proximate the workpiece. Accordingly, water gains speed as it passes through nozzle 136, which may be desirable for relatively low pressure applications.

Figure 4:
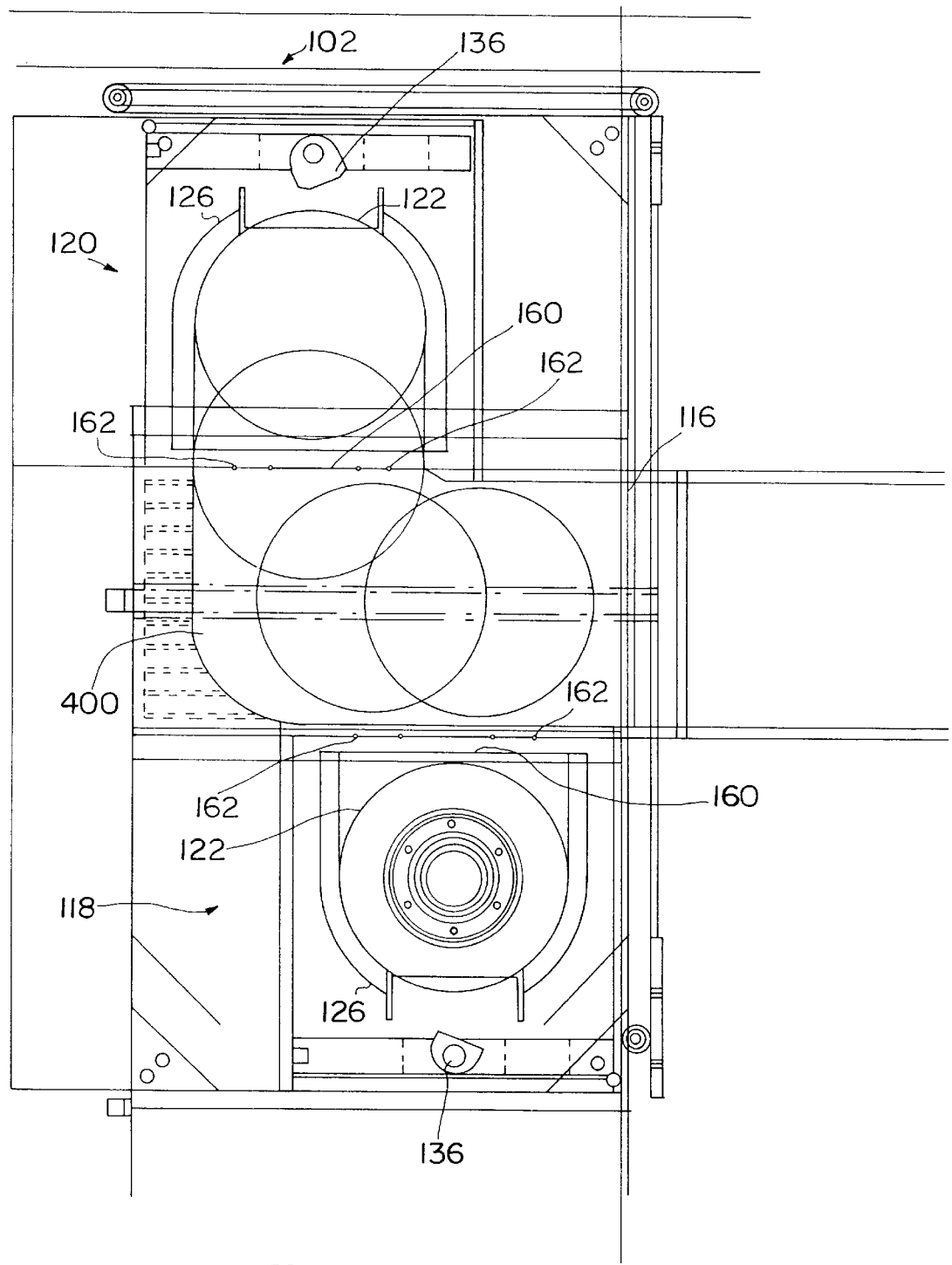
FIG. 4 is a top plan view of a workpiece load station, showing the path traveled by workpieces being discharged from one of the cassettes into the water track.

Referring now to FIGS. 1, 2, and 4, water track 116 suitably comprises an input module 400 configured to receive workpieces 122 discharged from respective loading assemblies 118 and 120, and to guide the workpieces 122 in a non-contacting fashion down water track 116 (e.g., to the right in FIG. 4).

As best seen in FIG. 4, in accordance with a preferred exemplary embodiment of the present invention, workpiece load station 102 suitably comprises a modified "T" configuration, wherein each of respective load assemblies 118, 120 are substantially orthogonal to the path of water track 116, yet offset from one another by a sufficient amount to ensure that a wafer discharged from one of the cassettes will not inadvertently contact the oppositely disposed cassette, for example if the discharge force is mistakenly set too high. As briefly discussed above, it will be appreciated that virtually any dual or plural cassette input configuration may be employed, for example a "Y" configuration, as desired. In this regard, it may be desirable to incorporate three or more cassette assemblies, using a fluid manifold to direct the workpieces discharged from the respective cassette assemblies onto water track 116.

Figure 5:
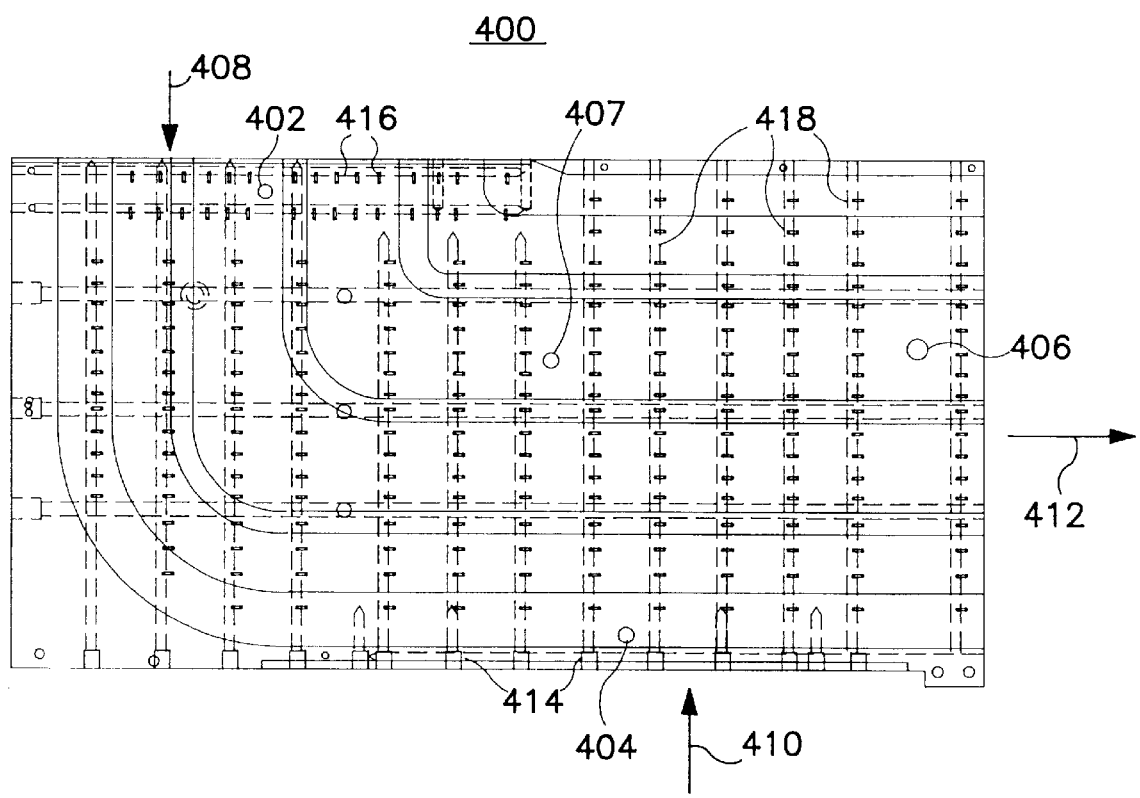
FIG. 5 is a detailed top plan view of an exemplary input manifold for receiving workpieces from two inputs and urging the workpieces along the water track.
Figure 6:
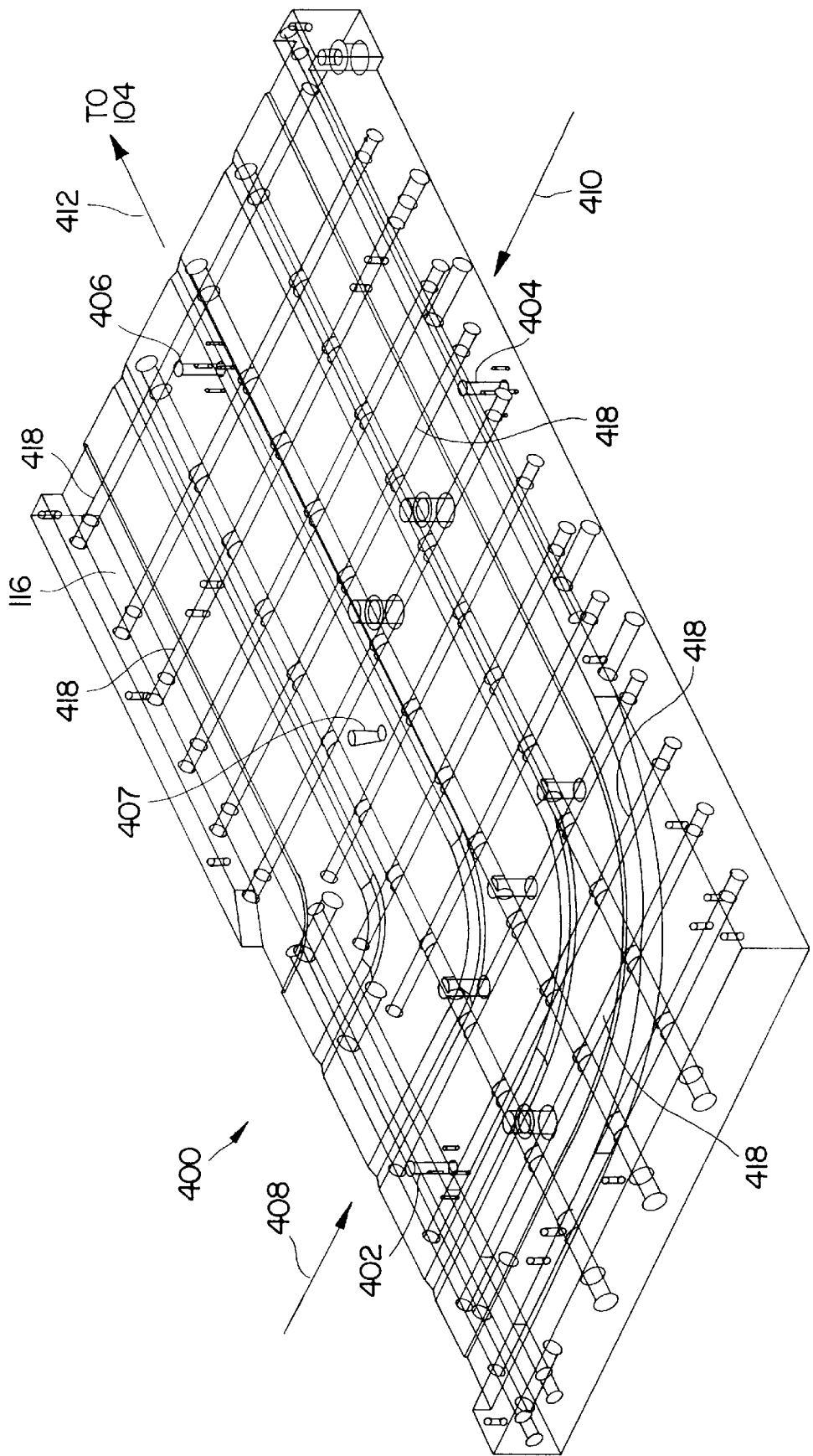
FIG. 6 is a perspective schematic view of the input module shown in FIG. 5 in accordance with a preferred exemplary embodiment of the present invention.

Referring now to FIGS. 4–6, input module 400 is suitably configured to receive workpieces discharged from load assembly 120 along arrow 408, and to receive workpieces discharged from load assembly 118 along arrow 410. Upon being received by input module 400, the workpieces are supported by fluid which is projected upwardly from the plane of the track through a plurality of fluid jets, as described in greater detail below, such that mechanical contact between the workpieces and input module 400 is substantially eliminated.

Input module 400 suitably comprises a plurality of pull jets 416 (see FIG. 5)configured to urge workpieces out of load assembly 120 along the direction of arrow 408. More particularly, pull jets 416 are suitably oriented to discharge fluid upwardly at an angle with respect to the horizontal plane on the order of 20°–70°, and most preferably about 45°, with the horizontal flow vector oriented along the direction of arrow 408. In this way, workpieces received from load assembly 120 are drawn into the fluid manifold comprising the interior portion of input module 400.

Input module 400 further comprises a plurality of pull jets 414, similar to pull jets 416, configured to draw workpieces discharged from load assembly 118 into the water track along the direction of arrow 410. After being received by input module 400, the workpieces discharged from loading station 102 are carried along water track 116 along the direction of arrow 412 to cleaning station 104. More particularly, input module 400 further comprises a plurality of rows 418, each comprising a number (e.g., 10–20 and most particularly about 17) of fluid jets configured to urge the workpieces along the direction of arrow 412. The fluidjets comprising rows 418 are also configured to discharge fluid upwardly from water track 116, and are suitably inclined with respect to the horizontal plane at an angle in the range of 20°–70°, and most preferably about 45°. In this way, workpieces received from load station 102 are urged along water track 116 substantially devoid of any mechanical contact.

With continued reference to FIGS. 4–6, a first workpiece detection sensor 402 is suitably disposed proximate discharge outlet 160 of load assembly 120; a similar workpiece detection sensor 404 is suitably disposed proximate discharge outlet 160 associated with load assembly 118. Respective workpiece sensors 402 and 404 monitor the steady state operation of machine 100, and may be configured to generate an alarm, or to stop the operation of machine 100 in the event the workpiece is detected as being "hung up" or otherwise lodged in the vicinity of the sensor. In addition, the sensors may be employed to count workpieces as they pass by the sensor (or to confirm that no workpieces are present) to thereby confirm that all of the workpieces have been discharged from a cassette.

A workpiece sensor 406 is also suitably disposed within input module 400 proximate the input to cleaning station 104. It should be appreciated that water track 116 may employ any number of sensors in addition to sensors 402, 404, and 406. For example, an exemplary embodiment of machine 100 utilizes a fourth sensor 407 positioned to monitor the progress or presence of workpieces 122 upon water track 116. It should be appreciated that sensor 407, and any of the other sensors, may be utilized to measure the throughput of the workpieces 122 or for any number of diagnostic purposes.

Workpiece sensors 402, 404, 406, and 407 may comprise any suitable mechanism for detecting the presence and/or absence of a workpiece, for example including optical sensors.

Referring now to FIGS. 7A–7E, an exemplary cleaning station 104 in accordance with a preferred embodiment of the present invention suitably comprises an enclosure, e.g., a scrubber box, enclosing a plurality of pairs of rollers. More particularly, cleaning station 104 suitably comprises a bottom panel 740, a top panel 742, a rear panel 744, and a front panel 738. In accordance with a particularly preferred embodiment, these panels comprise a self-contained box, which can be quickly and easily removed and replaced when it is desired to replace one or more of the rollers. The ability to quickly and conveniently remove and replace rollers and roller boxes in the context of the present invention further facilitates the substantially continuous operation of machine 100.

Figure 7A:
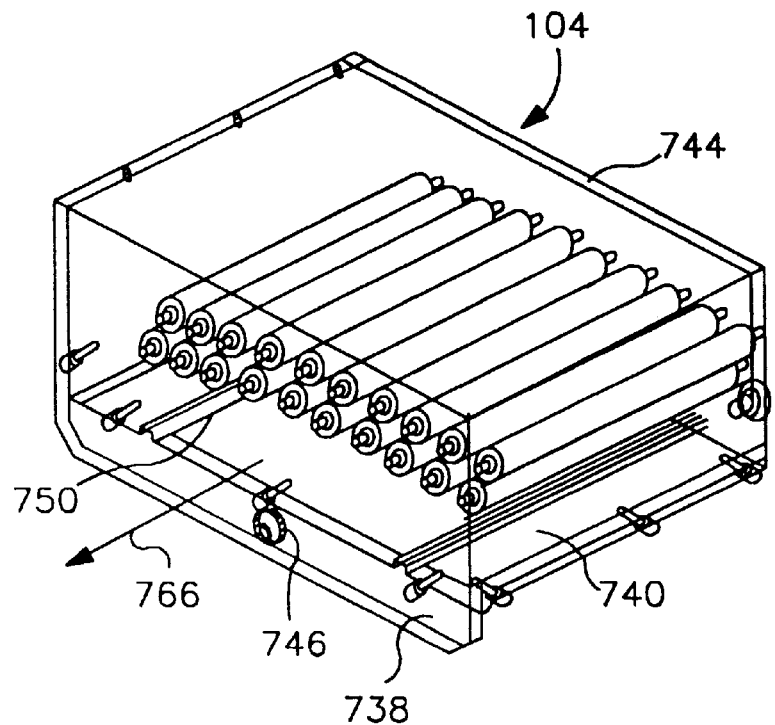
FIG. 7A is a perspective schematic view of an exemplary scrubber box having a plurality of respective pairs of rollers.
Figure 7B:
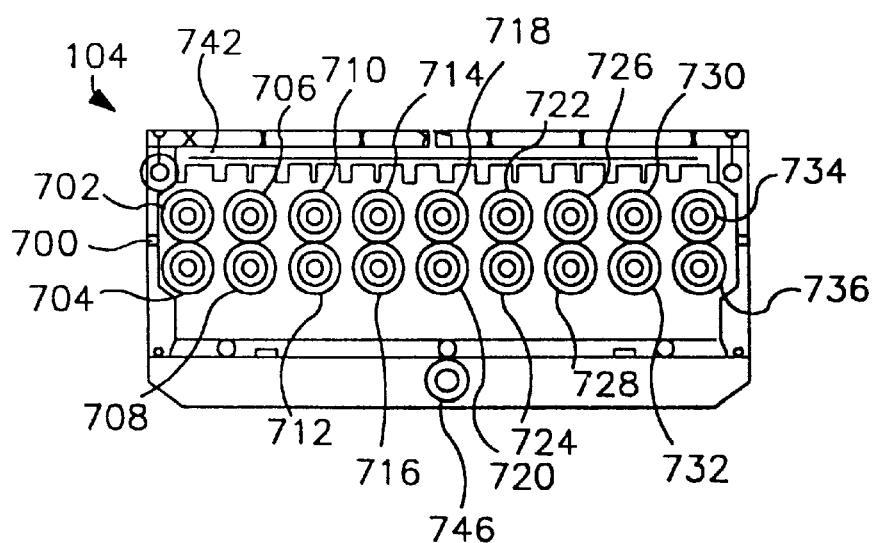
FIG. 7B is a schematic front elevation view of the scrubber box shown in FIG. 7A.
Figure 7D:
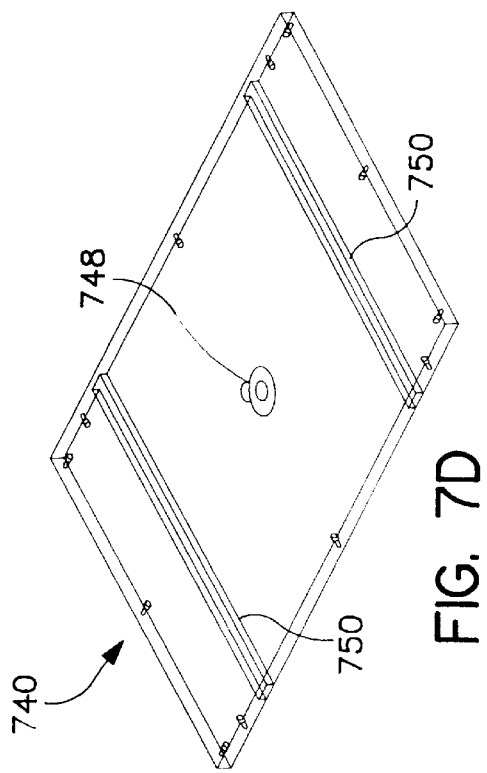
FIG. 7D is a perspective view of the bottom panel of the scrubber box shown in FIG. 7A.

With continued reference to FIGS. 7A–7E, cleaning station 104 suitably comprises a plurality of roller pairs configured to drive each workpiece through the roller box and to simultaneously clean the top and bottom flat surfaces of each workpiece passing therethrough. As shown in FIG. 7B, cleaning station 104 preferably includes a workpiece input 700 configured to suitably receive workpieces into the enclosure. When the workpiece enters the enclosure, the first pair of drive rollers (described below) "grabs" the workpiece and feeds it to the next pair of rollers.

More particularly, and with particular reference to FIG. 7B, cleaning station 104 suitably comprises on the order of 5–15 pairs of rollers, and most preferably about 9 pairs of rollers. In the illustrated embodiment, the scrubber box includes a first roller pair comprising respective rollers 702 and 704; a second roller pair comprising upper roller 706 and lower roller 708; a third roller pair comprising upper roller 710 and lower roller 712; a fourth pair comprising upper roller 714 and lower roller 716; a fifth pair comprising upper roller 718 and lower roller 720; a sixth pair comprising upper roller 722 and lower roller 724; a seventh pair comprising upper roller 726 and lower roller 728; an eighth pair comprising upper roller 730 and lower roller 732; and a ninth, terminal roller pair comprising upper roller 734 and lower roller 736. As best viewed in FIG. 7B, machine 100 is suitably configured such that workpieces enter cleaning station 104 from the far left and are sequentially urged through the roller box, being discharged from the roller box at the far right position (proximate rollers 734 and 736).

In accordance with a preferred exemplary embodiment, each of the odd pairs of rollers (e.g., the first, third, fifth, seventh, and ninth roller pairs) function as drive rollers, with each drive roller pair operating at a drive speed S1. As such, rollers 702, 704, 710, 712, 718, 720, 726, 728, 734, and 736 operate at drive speed S1.

Moreover, each of the bottom rollers (i.e., rollers 704, 708, 712, 716, 720, 724, 728, 732, and 736) rotate clockwise as shown in FIG. 7B. In addition, the top roller of each even roller pair (i.e., rollers 706, 714, 722, and 730) also rotate clockwise from the perspective shown in FIG. 7B. Finally, the top roller in each odd roller pair (i.e., rollers 702, 710, 718, 726, and 734) advantageously rotates counterclockwise.

With continued reference to FIG. 7B, in accordance with a preferred embodiment every even bottom roller (i.e., rollers 708, 716, 724 and 732) is advantageously configured to operate at a second drive speed S2. Finally, every even top roller (i.e., rollers 706, 714, 722 and 730) is advantageously configured to operate at a process speed S3. In addition, the tension between the two rollers comprising each respective roller pair is suitably approximately uniform throughout the roller box.

In accordance with a preferred exemplary embodiment of the present invention, each odd roller pair is suitably driven by a first drive motor so that each odd roller pair (the "drive rollers") drive the workpieces through the cleaning station at an essentially uniform rate. In accordance with a particularly preferred embodiment, every even top roller is suitably driven by a second motor at process speed S3; every even bottom roller are suitably driven by the second motor at second drive speed S2 at a predetermined gear ratio below process speed S3. In this way, the operator may control the drive speed S1 by setting a first control associated with the first motor; the operator may also independently control drive speed S3 by manipulating a second control associated with the second motor. By so doing, the operator also indirectly controls drive speed S2, as drive speed S2 suitably follows drive speed S3 in accordance with the predetermined gear ratio discussed above. By allowing the operator to dynamically configure respective drive speeds S1, S2, and S3, substantial processing flexibility is achieved in cleaning station 104. Moreover, by setting S3 higher than S1, in accordance with a preferred embodiment, the even roller pairs effectively simultaneously clean the top and bottom surfaces of the workpieces as the workpieces are moved through the scrubber box at drive speed S1 by the drive rollers (e.g., the odd roller pairs).

Although the aforementioned roller speeds reflect the best mode of practicing the invention known to the inventors at the time this application was filed, it is to be understood that virtually any number of rollers and any combination of roller speeds and roller directions may be employed in the context of the present invention. For example, two, three, or even more than three different roller speeds may be employed, with various permutations and combinations of speed and direction used by each of the rollers within the roller box to achieve optimum cleaning performance for any desired process.

With continued reference to FIGS. 7A–7E, cleaning assembly 104 is advantageously configured for easy installation into and removal from machine 100. More particularly, bottom panel 740 suitably comprises one or more grooves (e.g., dovetail grooves) 750 to permit sliding engagement of cleaning assembly 104 to machine 100. For example, machine 100 may advantageously comprise a frame portion having corresponding ridges (not shown) configured to be received within grooves 750 for convenient sliding engagement and alignment of cleaning assembly 104 with respect to machine 100. Bottom panel 740 further comprises a fluid outlet 748 through which cleaning fluid may flow out of cleaning station 104, as described in greater detail below. If desired, the fluid retrieved from fluid outlet 748 may be recycled.

Figure 7E:
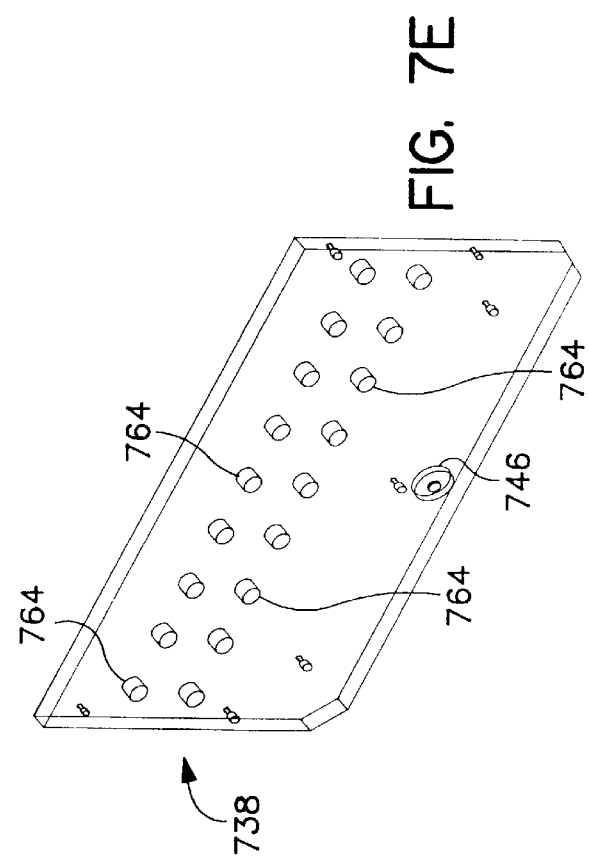
FIG. 7E is a perspective view of the front panel of the scrubber box shown in FIG. 7A.
Figure 7C:
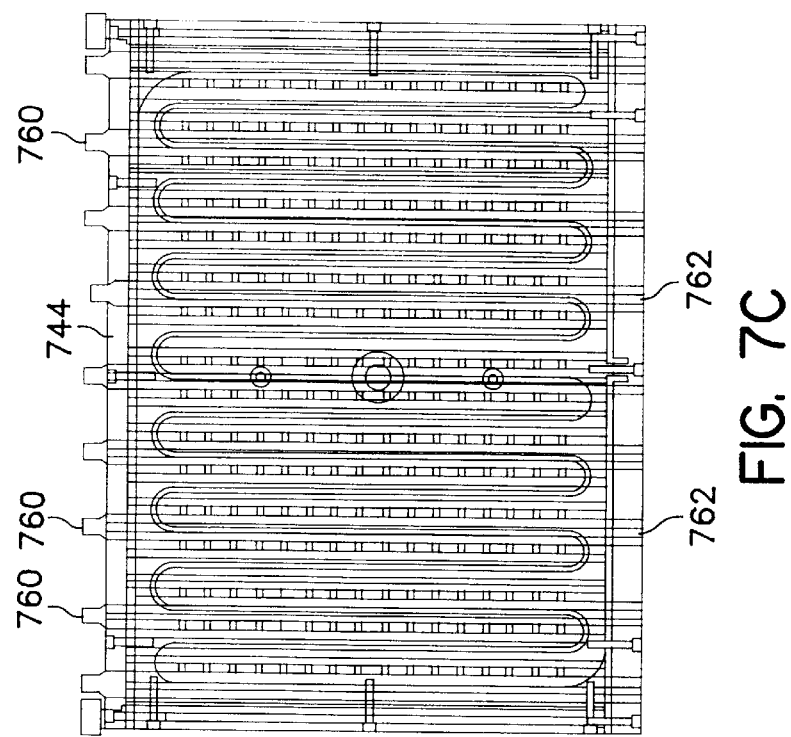
FIG. 7C is a top view of the scrubber box of FIG. 7A.

Referring now to FIGS. 7A, 7C, and 7E, each of respective drive rollers 702–736 comprise a gear end 760 and a follower end 762. In accordance with the illustrated embodiment, each of the respective gear ends 760 are configured to extend through rear panel 744. Each respective follower end 762 is advantageously configured for rotating receipt within respective follower junctions 764 configured in front panel 738. In addition, front panel 738 further comprises a fastener assembly 746 for securing cleaning assembly 104 to the frame (not shown) of machine 100. It will be appreciated that fastener assembly 746 may comprise a screw, bolt, quick release, or any other suitable fastening mechanism for securably but releasably engaging cleaning assembly 104 to the frame of machine 100.

With continued reference to FIGS. 7A and 7C, cleaning assembly 104 may be conveniently removed and replaced as follows. Machine 100 may be placed in the off or hold mode of operation to permit the removal and replacement of cleaning assembly 104. In this condition, fastener assembly 746 is disengaged, for example by unscrewing a screw associated with fastener 746. Cleaning station 104 may then be manually removed by the operator by pulling the box, for example along arrow 766 in FIG. 7A. Gear ends 760 of the rollers are suitably passively disengaged from the drive mechanism (not shown) associated with machine 100 as cleaning station 104 is slid along arrow 766, guided by grooves 750. Once cleaning station 104 is removed, a replacement box prepared by the operator in advance may be inserted in place of the removed box; alternatively, cleaning station 104 may be opened and the rollers quickly replaced so that the refurbished cleaning station may be quickly placed back onto machine 100. In either case, cleaning station 104 may be reassembled to machine 100 by aligning grooves 750 with corresponding ridges associated with the machine, and sliding the box back into the original operating position. Grooves 750 facilitate the alignment of gear ends 760 into the mating drive mechanism (not shown for clarity) associated with machine 100. When cleaning station 104 is reassembled into its operating position, fastener 746 may be reengaged by the operator to secure the cleaning station 104 in place. Of course, any fluid inlet, fluid discharge, or workpiece sensing hardware associated with cleaning station 104 may also have to be attended to during removal and reinstallation.

Referring now to FIGS. 7B, 8A, 8B, and 9, top panel 742 further comprises one or more fluid inlet ports configured to distribute fluid to a discrete portion of or to the entirety of the inside of cleaning assembly 104. FIG. 8A depicts a horizontal cross section of an exemplary top panel 742 configured as a fluid manifold system and FIG. 8B depicts a vertical cross section of top panel 742. Top panel 742 preferably includes a number of manifolds arranged to deliver fluid to specific locations within the scrubber box. More particularly, top panel 742 suitably comprises a first fluid inlet port 802 that communicates with a first manifold 803 configured to distribute a first fluid proximate a number of rollers within the roller box. First manifold 803 is preferably disposed to advantageously release fluid substantially evenly along the length of one or more of the top rollers. Top panel 742 further comprises a second fluid inlet port 804 similarly configured in communication with a second manifold 805 for distributing a second fluid throughout a different portion of the roller box, for example in the region occupied by the first several roller pairs. Top panel 742 further also comprises a third fluid inlet port 806 in communication with a third manifold 807 configured to distribute a third fluid throughout a third region of the roller box, for example a region proximate the last several roller pairs. Similarly, top panel 742 may include a fourth fluid inlet port 808 that communicates with a fourth manifold 809.

Each individual manifold is suitably configured such that it is fluidly distinct from each of the remaining manifolds. However, one or more of the fluid inlet ports may be coupled together such that a single fluid may be applied to more than one manifold. In the exemplary embodiment shown in FIG. 8A, the manifolds are configured to distribute cleaning fluid to locations between adjacent rollers (the rollers are depicted in phantom lines in FIG. 8A). This arrangement is desirable to allow the cleaning fluid to reach the workpiece as it passes through the scrubber box.

In the preferred embodiment, each individual manifold includes a plurality of extending channels 812. Furthermore, channels 812 associated with opposing manifolds, e.g., first manifold 803 and third manifold 807, may be arranged in an alternating configuration. Of course, it is to be appreciated that any number of fluid inlet ports and/or fluid manifolds may be employed in conjunction with cleaning station 104, and that the manifolds may communicate with any desired portion of cleaning station 104 with or without overlap, as desired to optimize particular processing applications.

In the preferred embodiment, top panel 742 is manufactured as a one-piece, substantially seamless assembly. The seamless construction enables manifolds 803, 805, 807, and 809 to be pressurized without leaking cleaning fluid, water, or chemicals to the external portion of cleaning station 104. In one exemplary construction, manifolds 803, 805, 807, and 809 are formed by drilling or boring into a solid piece of plexiglass or other rigid material. Channels 812 (oriented vertically in FIG. 8A) are formed such that adjacent channels originate at opposite sides of top panel 742. Thereafter, several channels that originate from a common side are "connected" together by an intersecting channel 814 (oriented horizontally in FIG. 8A). Plugs may be employed to seal the entry holes formed during the boring or drilling process.

Each of the manifolds described above preferably dispenses a respective fluid into cleaning assembly 104 through a number of orifices 810. Orifices 810 are formed within top panel 742 such that they communicate with the manifolds. Orifices 810 may be formed using conventional drilling or other techniques. Although alternate manifolds may utilize a discrete nozzle element to eject fluid into the scrubber box, orifices 810 may be desirable to increase the sealing integrity of top panel 742. In addition, the cost to manufacture and maintain top panel 742 can be reduced by eliminating distinct nozzle elements.

Figure 10A:
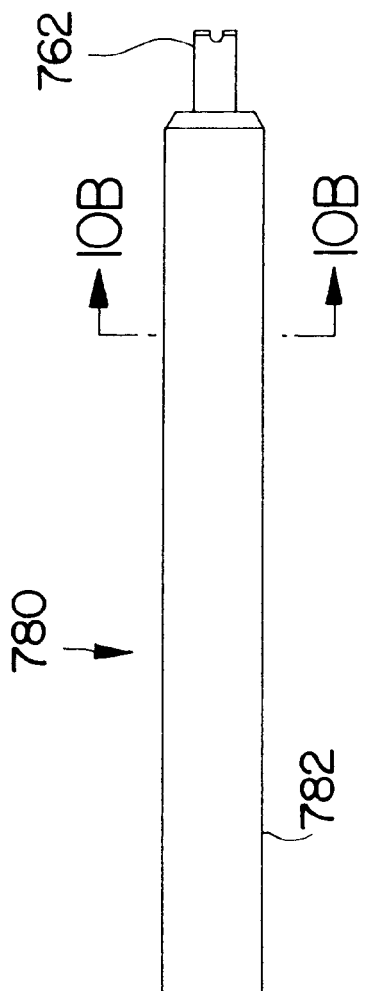
FIG. 10A is a top plan view of an exemplary roller bar useful in the context of the roller box shown in FIGS. 7A and 7B.
Figure 10B:
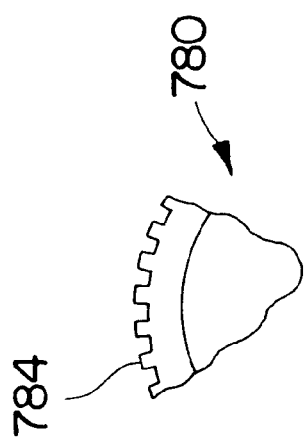
FIG. 10B is a cross-section view of the shaft portion of the roller bar shown in FIG. 10A.
Figure 12:
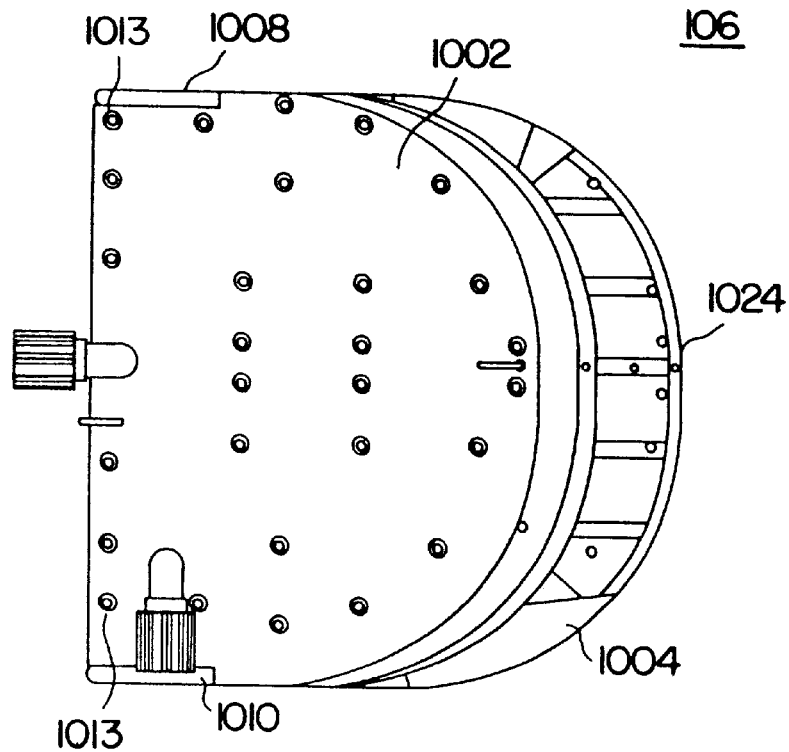
FIG. 12 is a top view of the rinse station shown in FIG. 11.

Referring now to FIGS. 7B, 10A, and 10B, each of the rollers within cleaning station assembly 104 suitably comprises a roller carrier 780, comprising a gear end 760, a follower end 762, and an elongated shaft 782. As shown in cross-section in FIG. 10B, shaft 782 suitably comprises peripheral structures 784 suitable for engaging a soft, spongy elongated annular ring (not shown) about shaft 782. Although surface structures 784 are illustrated as elongated, parallel geared teeth, virtually any mechanism may be employed which facilitates a strong frictional fit between shaft 782 and the spongy roller material. In this way, slippage between the inner roller body shaft and the outer spongy roller material may be minimized, while at the same time facilitating the easy removal and reinsertion of roller material off of and onto roller carrier 780. In this regard, suitable roller material may comprise PVA rollers available from the Meracel Company of New Jersey.

Referring now to FIGS. 1, 2, and 11–14, preferred exemplary embodiments of the construction and operation of rinsing station 106 will now be described.

As each workpiece comes out of cleaning station 104, it is received by rinsing station 106. In an exemplary embodiment, the air gap between cleaning station 104 and rinse station 106 is relatively small, e.g., approximately 3/16 inch, to ensure that the wafer workpiece does not appreciably dry between the cleaning and rinsing processes. Generally, rinse station 106 is configured to receive workpieces in a serial manner, thoroughly rinse each workpiece with one or more rinsing solutions such as deionized water, and hold each rinsed workpiece for manipulator 108, which thereafter transports the rinsed workpiece to spin-dry station 110 (see FIG. 1). More particularly, a preferred exemplary embodiment of rinse station 106 includes an upper portion 1002, a lower portion 1004 coupled to upper portion 1002, and a support stand 1006 configured to couple lower portion 1004 to machine 100.

Upper portion 1002 is held above lower portion 1004 by upstanding brackets 1008 and 1010 such that an entry passage 1012 (see FIG. 13) is defined between brackets 1008 and 1010. Entry passage 1012 is suitably located proximate the input side edges of upper and lower portions 1002 and 1004. Workpieces pass through entry passage 1012 as they transfer from cleaning station 104 to rinse station 106. In the preferred embodiment, a number of initial rinsing jets (obscured from view in the Figures) are suitably positioned at upper portion 1002 and/or lower portion 1004 proximate entry passage 1012 to immediately begin rinsing the workpiece and to prevent drying of the workpiece. In one exemplary embodiment, the initial fluid jets are located within upper portion 1002 at or near the column identified by reference number 1013 in FIG. 12. These initial rinsing jets may be configured to direct the rinsing fluid at any suitable angle relative to the upper surface 1014 of lower portion 1004. Preferably, the initial rinsing jets direct the fluid approximately perpendicular to upper surface 1014 or at a forward angle relative to the entry path of the workpiece. Such a forward directed angle is identified in FIG. 11 as arrow 1016.

Figure 11:
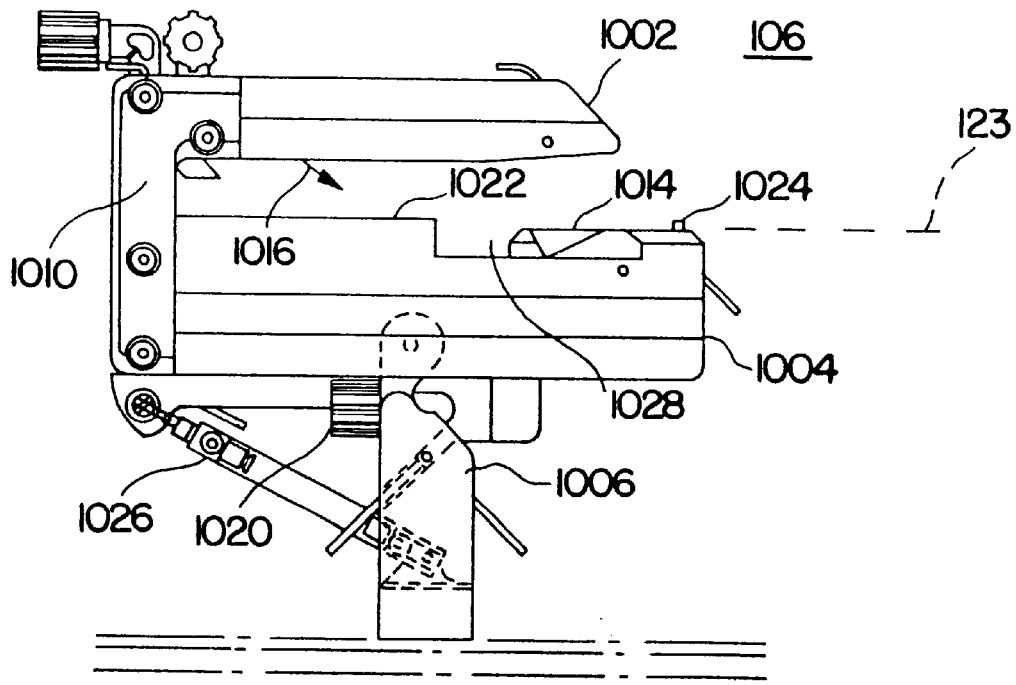
FIG. 11 is a side view of an exemplary rinse station employed by the present invention.
Figure 13:
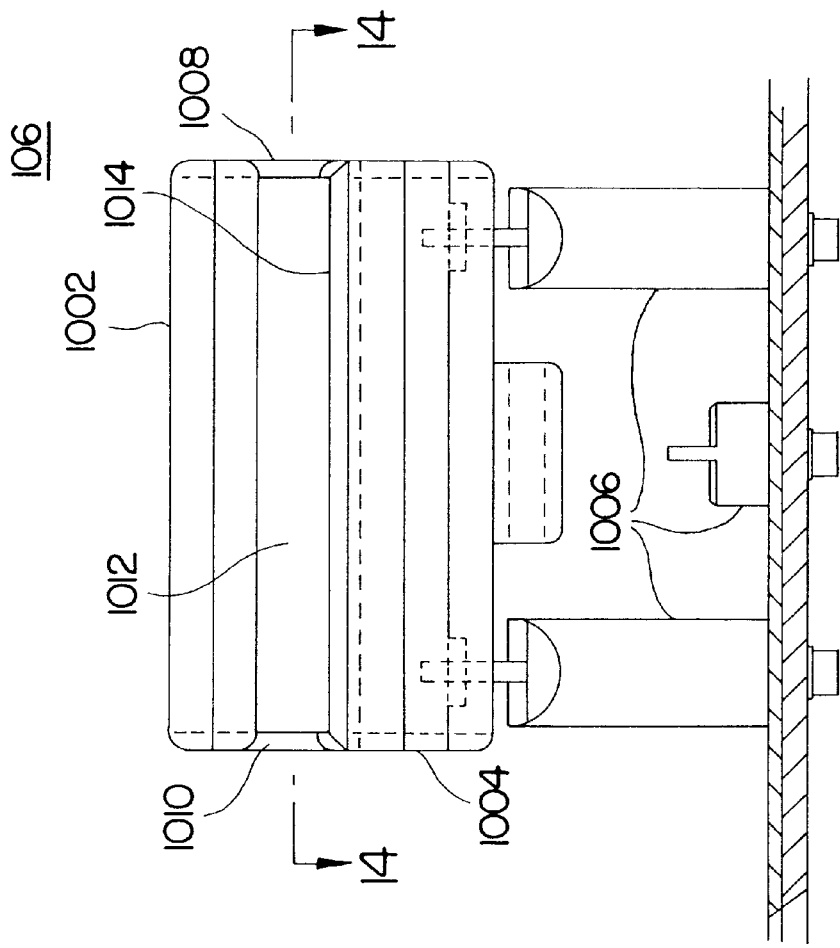
FIG. 13 is a front plan view of the rinse station shown in FIG. 11.

With particular reference to FIGS. 1 and 11, as a workpiece 122 is discharged from cleaning station 104, the plane of travel of the workpiece 122 is substantially defined by plane 123. As best seen in FIG. 11, plane 123 is slightly above (e.g., 5–20 mm and preferably about 10 mm) upper surface 1014 of lower portion 1004. The fluid (not shown) ejected from a plurality of lower jets 1018 (see FIG. 14) supports workpiece 122 as it is transferred from the cleaning station 104 to the rinse station 106. The fluid from lower jets 1018 also rinses the under surface of workpiece 122 during transport and rinsing. At least one fluid supply port 1020 of suitable configuration may be employed to provide fluid from an external source to lower portion 1004. Preferably, fluid supply port 1020 communicates with a distribution manifold (not shown) formed within lower portion 1004; the distribution manifold fluidly couples the lower jets 1018 together.

Upper portion 1002 may include a plurality of upper jets (hidden from view in the Figures) configured to direct rinsing fluid to the upper surface of the workpiece 122 during transfer from cleaning station 104 and during the rinsing process. In the preferred exemplary embodiment, the upper jets are aligned at forward angle 1016 to urge the workpiece completely forward into rinse station 106. Preferably, the upper jets direct fluid at an angle of approximately 10 to 60 degrees relative to upper portion 1002. To ensure that the workpiece is properly guided to the rinsing position within rinse station 106, lower portion 1004 may include any number of wafer guides 1022. In the illustrated embodiment, wafer guides 1022 are formed as integral walls proximate the outer opposing edges of lower portion 1004. Wafer guides 1022 are preferably configured and sized such that plane 123 resides beneath the upper height of wafer guides 1022.

Lower portion 1004 preferably contains at least one centering pin. 1024 configured to maintain the workpiece 122 within a rinse area of rinse station 106. The rinse area may be defined as the forward-most position that workpiece 122 may obtain within rinse station 106. In particular, workpiece 122 contacts centering pin 1024 when it has traveled forward a predetermined distance. With particular reference to FIG. 11, when a workpiece is substantially centered within the rinse station 106 and supported by the supporting fluid ejected from lower jets 1018 (see FIG. 14), the workpiece is said to be completely transferred from cleaning station 104 and residing within the rinse area. At that point, rinse station 106 is caused to tilt downwardly, deviating from the horizontal plane by an angle in the range of 10°–50°, and most preferably about 30°. As depicted in FIG. 11, a tilt control mechanism 1026, e.g., a solenoid-actuated extension arm, is activated to urge rinse station 106 into the tilted position.

In the tilted position, rinsing fluid is supplied to both the upper surface and bottom surface of the workpiece. Upper jets and lower jets 1018 are preferably pressurized to deliver a suitable stream of fluid, such as deionized water, to the workpiece. It should be appreciated that workpiece throughput may be increased by simultaneously rinsing both the upper and lower surfaces of each workpiece. Moreover, the locations of upper jets and lower jets 1018 may be suitably arranged relative to the upper surface of the workpiece such that the entire surface of the workpiece and the perimeter edge of the workpiece are effectively rinsed. In a preferred exemplary embodiment, rinse station 106 employs approximately 256 individual fluid jets that support, transport, and rinse the workpieces. The multiple jets facilitate uniform rinsing and enhanced surface coverage of the workpiece.

In a preferred embodiment, rinse fluid is applied to the top surface at a rate in the range of 0.1–20 liters/minute, and most preferably about 4–5 liters/minute; similarly, rinse fluid is advantageously applied to the bottom surface at a rate in the range of 0.1–10 liters/minute, and most preferably about 1.5 liters/minute. The individual jets are preferably sized and configured to provide substantially uniform fluid pressure during the rinsing process. Machine 100 controls the supply of rinse fluid such that fluid is conserved when the rinsing cycle is completed.

Upon completion of the rinsing operation, the then tilted rinse station 106 is manipulated back to the horizontal position, whereupon manipulator 108 retrieves the rinsed workpiece and transfers the workpiece to spin-dry station 110. It should be appreciated that manipulator 108 and rinse station 106 may be alternatively configured such that the workpiece is removed from rinse station 106 while rinse station 106 is in the tilted position.

Figure 14:
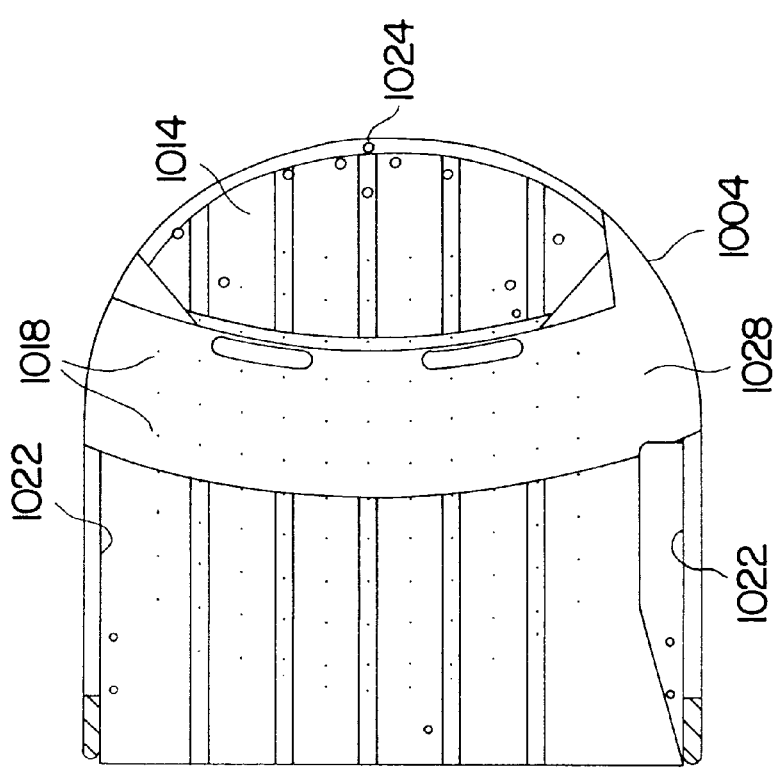
FIG. 14 is a cross sectional depiction of the rinse station viewed from line 14—14 in FIG. 13.

Referring to FIGS. 11 and 14, to facilitate cooperation with manipulator 108, lower portion 1004 of rinse station 106 may include an arcuate recess 1028 formed therein. Recess 1028 is configured to receive a portion of manipulator 108 when rinse station 106 is in the horizontal position. When the workpiece is positioned fully forward within rinse station 106, recess 1028 is located beneath the workpiece.

Figure 16:
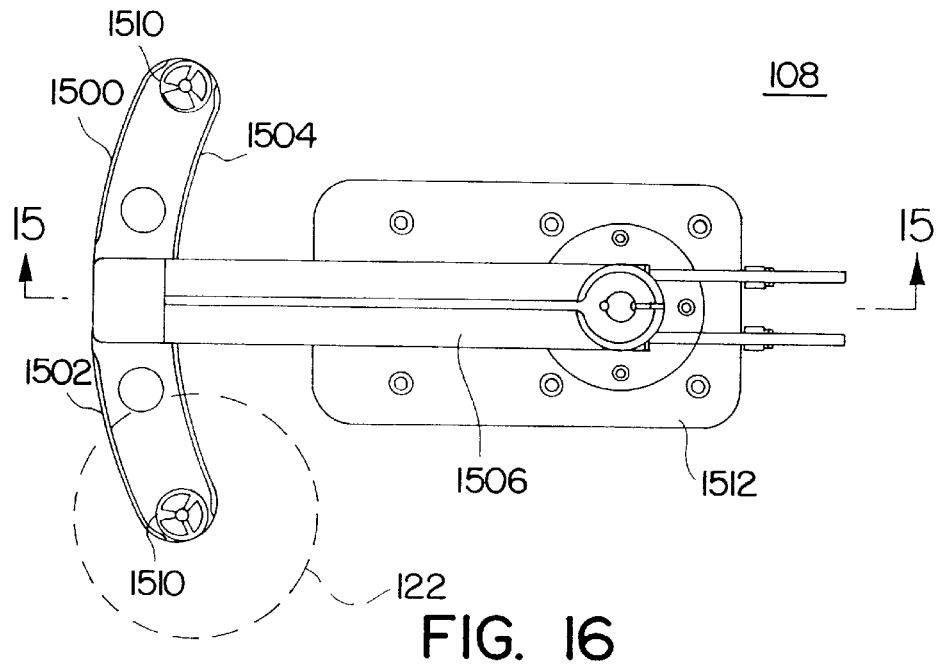
FIG. 16 is a top view of the manipulator utilized by the present invention.
Figure 15:
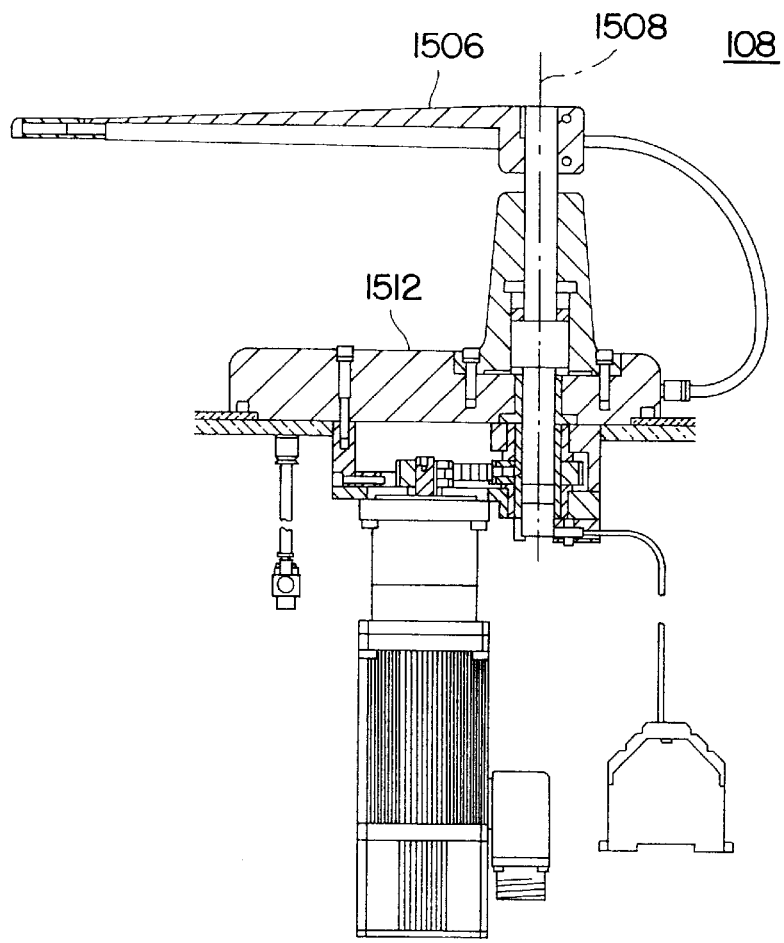
FIG. 15 is a cross sectional depiction of a manipulator utilized by the present invention, as viewed from line 15—15 in FIG. 16.

Referring now to FIGS. 15 and 16, and with continued reference to FIG. 14, manipulator 108 suitably includes an arcuate-shaped arm 1500 configured to retrieve a rinsed workpiece from rinse station 106 and to transfer the workpiece to spin-dry station 110. In the preferred embodiment, spin-dry station 110 includes at least two spin-dry assemblies 111 and 113. The use of rinse station 106, manipulator 108, and dual spin-dry station 110 in accordance with the present invention further facilitates increased workpiece throughput through machine 100.

Manipulator 108 preferably includes a base 1512 coupled to machine 100. A swing arm 1506 is preferably coupled to base 1512 such that it is capable of rotation about a substantially vertical axis of rotation. As shown in FIG. 16, first and second transport sections 1502 and 1504 are located at the free end of swing arm 1506. Base 1512 may include any number of conventional electromechanical components for rotating and lifting swing arm 1506 in accordance with operating protocols employed by manipulator 108.

Arm 1500 preferably includes first workpiece transport section 1502 and second workpiece transport section 1504 generally located on opposite sides of arm 1500. First and second transport sections 1502 and 1504 are sized to fit within recess 1028 (see FIG. 14) and beneath the workpiece residing within rinse station 106. Although first and second transport sections 1502 and 1504 are configured to be received within recess 1028, swing arm 1506 (coupled to arcuate arm 1500) may not pass under the workpiece if it is in a lowered position. For example, while in a lowered position, manipulator 108 causes swing arm 1506 to rotate about a vertical rotational axis 1508 such that first transport section 1502 resides within recess 1028 and underneath the workpiece.

Next, manipulator 108 causes swing arm 1506 to lift upward along the direction defined by axis 1508. A first suction pad 1510 associated with first transport section 1502 may be activated to gently secure the workpiece to first transport section 1502 during the transfer from rinse station 106 to spin-dry station 110. A typical position for a workpiece 122 positioned upon first transport section 1502 is illustrated in phantom lines in FIG. 16. Swing arm 1506 is suitably raised to a height sufficient to enable swing arm 1506 and workpiece 122 to pass between upper portion 1002 and lower portion 1004 of rinse station 106. Thereafter, swing arm 1506 rotates to deposit the workpiece onto, e.g., first spin-dry assembly 111. Swing arm 1506 may suitably lower arcuate arm 1500 onto first spin-dry assembly 111 and rotate to a predetermined wait position between spin-dry station 110 and rinse station 106.

In the preferred embodiment, manipulator 108 may pause until the next workpiece is fully rinsed by rinse station 106. When the next workpiece is ready for spin-drying, manipulator 108 causes second transport section 1504 to move beneath the workpiece, and the procedure described above in connection with the previous workpiece is repeated until the workpiece is deposited onto second spin-dry assembly 113. The use of two transport sections enables manipulator 108 to be of a relatively simple design having only one axis of rotation and having a limited range of rotation. In addition, manipulator 108 may be realized by a "dumb" robot having no interactive sensors or complex control protocols. Consequently, manipulator 108 may be reliably and robustly operated to process a large quantity of workpieces without maintenance or supervision.

Those skilled in the art will recognize that any suitable actuating mechanism, control system, motor, and the like, may be utilized in a practical realization of manipulator 108. Accordingly, the specific operating elements of manipulator 108 need not be described in detail herein.

The construction and operation of a preferred exemplary embodiment of respective spin-dry assemblies 111 and 113 will now be described in connection with FIGS. 17–20. Those skilled in the art will appreciate that the present invention may be utilized in the context of any number of spin-dry assemblies other than that shown and described herein.

Each spin-dry assembly 111,113 in accordance with the present invention suitably comprises a spin platform 1600 configured to hold the workpiece as it is spin dried. More particularly, platform 1600 suitably comprises a flat upper surface 1602 having a plurality (e.g., 3 or 5) of slots 1610 which extend through disk shaped platform 1600. The under surface of platform 1600 suitably comprises a hub 1606 having a cylindrical cavity 1604 for receiving a drive shaft (not shown); the drive shaft is suitably connected to a spinner motor, discussed below, for rotating support platform 1600. A bob 1800 is suitably disposed within each slot 1610 and configured to clamp a workpiece during the rotation of spin platform 1600, as described in greater detail below. In a preferred exemplary embodiment, five bobs 1800 are employed such that spin-dry assemblies 111 and 113 can be used with conventional round wafer workpieces or substantially round wafer workpieces having a straight-edged portion. An alternate embodiment with only three bobs 1800, although suitable for round wafer workpieces, may not effectively clamp a straight-edged wafer if the straight portion is aligned with one of the bobs 1800.

Each bob 1800 suitably comprises an upper body portion 1802, a lower body portion 1804, a pivot arm 1810, a wafer clamp 1806, a button 1808, and a spring seat 1812. Each bob 1800 is suitably pivotably secured within each respective slot 1610 through any convenient mechanism, for example by extending pivot bar 1810 through corresponding pivot supports (not shown) in platform 1600.

During the operation of spin platform 1600, i.e., when spin platform 1600 is spinning, the perimeter of workpiece 122 is suitably clamped by respective bobs 1800. More particularly, a suitable spring 1608 is configured to bias bob 1800 such that wafer clamp 1806 is urged upwardly; in so doing, each wafer clamp is also urged inwardly, securely holding workpiece 122 in place as shown in FIG. 18. When it is desired to unload a dried workpiece from the spin platform 1600 and to load a new, recently rinsed workpiece onto the empty spin platform 1600, a respective button actuator assembly 1704 disposed proximate each of the bobs 1800 is configured to extend upwardly along arrow 1702 and contact the under surface of bob 1800, generally as indicated by arrow 1702. As a result, the spring force exerted by spring 1608 is counteracted, such that each wafer clamp 1806 associated with each bob 1800 is urged radially outwardly allowing workpiece 122 to drop downwardly, supported only by respective buttons 1808. In this regard, each respective button 1808 is suitably made from a soft, resilient material which will not damage the under surface of the workpiece 122. With the wafer clamps in this retracted position, transfer mechanism 112 retrieves the workpiece and transfers it to unload station 114 (see FIG. 1).

While one workpiece is being dried or transferred from a spin-dry assembly 111, 113 to unload station 114, a second workpiece may be manipulated by manipulator 108. More particularly, with respective wafer clamps 1806 in their retracted, unclamped positions, manipulator 108 places a workpiece on spin platform 1600 supported only by respective buttons 1808. Next, button actuators 1704 are moved downwardly, such that each respective spring 1608 causes each bob 1800 to pivot about pivot bar 1810, such that the respective wafer clamps 1806 are urged radially inwardly, thereby clamping the workpiece. The respective button actuators 1704 may be urged upwardly and downwardly through any desired mechanism, for example pneumatically. The beveled configuration of respective clamps 1806 permit the clamps to lift the workpiece off of the buttons slightly, suitably to preclude contact between the workpiece and the buttons during the spinning operation.

In this initially clamped position, spin platform 1600, driven by the drive motor (not shown) discussed below, begins spinning at relatively low rpms (e.g. in the range of 500 rpm). Once a desired secondary clamping spin speed is achieved, centrifugal force causes each bob 1800 to further pivot about pivot bar 1810, such that the respective wafer clamps 1806 more securely hold the workpiece.

Although not shown, each of respective spin-dry assemblies 111, 113 may be enclosable within a protective spin-dry chamber. Alternatively, and preferably, each spin-dry assembly 111, 113 includes a shield assembly 1820 configured to substantially surround the respective platform 1602. During the spin-dry operation, i.e., when the recently rinsed workpiece is spun at high speed to remove water from the surfaces of the workpiece, respective shield assemblies 1820 are advantageously raised to prevent fluid or debris which is thrown off of or otherwise liberated from the workpiece and the spin-dry assembly 111, 113 from contaminating dry wafers within unload station 114 or wafers currently being processed by the neighboring spin-dry assembly. Accordingly, shield assembly 1820 is suitably formed from a material substantially impermeable by cleaning and rinsing fluids, compounds, and other chemicals employed by machine 100.

Figure 20:
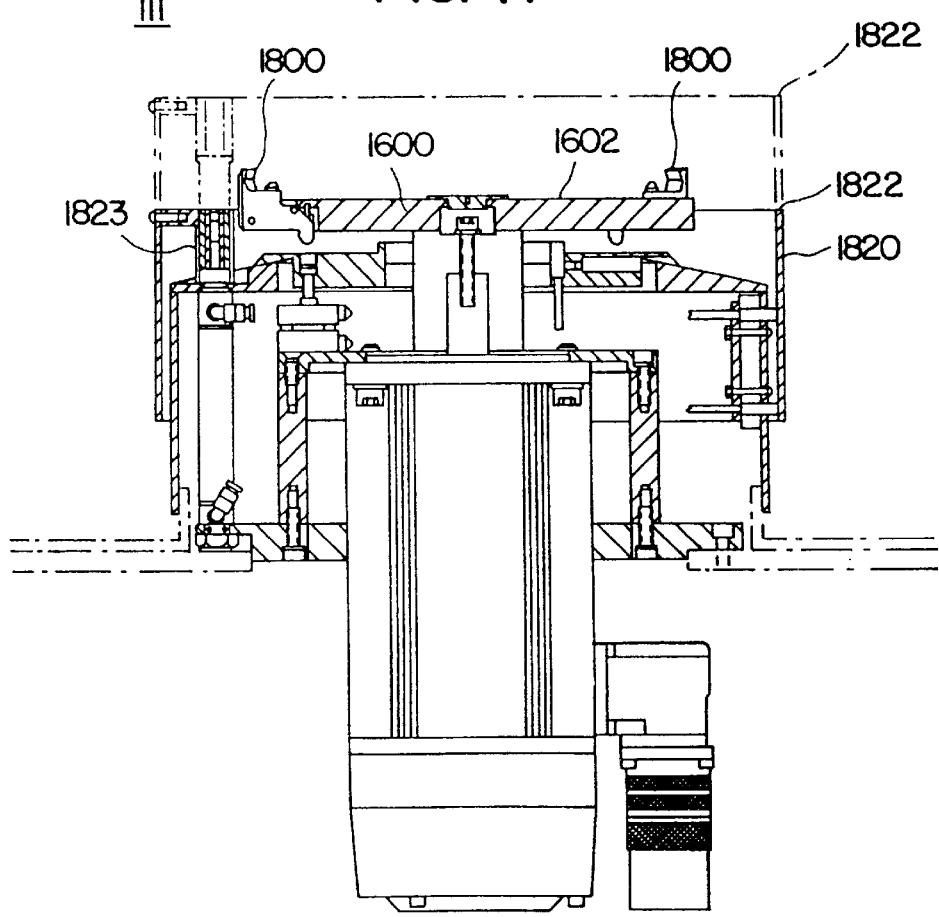
FIG. 20 is a cross sectional depiction of a spin-dry assembly that incorporates the spin platform shown in FIGS. 17 and 18.

FIG. 20 depicts shield assembly 1820 in a lowered position (solid lines) and in a raised position (phantom lines). Shield assembly 1820 preferably includes a perimetrical upper edge 1822 that resides at a suitable height above spin platform 1600 during the spin-drying process. After the spin-drying process is complete, upper edge 1822 is lowered to a height below the upper surface 1602 of spin platform 1600. In the preferred embodiment, the upper edge 1822 raises approximately one inch (1") above upper surface 1602 of spin platform 1600. The specific height may vary depending upon the spinning speed, the arrangement of neighboring components of machine 100, or the amount of protection desired. Shield assembly 1820 may be raised and lowered by any number of suitable actuating mechanisms 1823, such as a solenoid or a pneumatic lifter. Actuating mechanisms 1823 may be controlled in accordance with timing protocols associated with the respective spin-dry assembly 111, 113.

Figure 17:
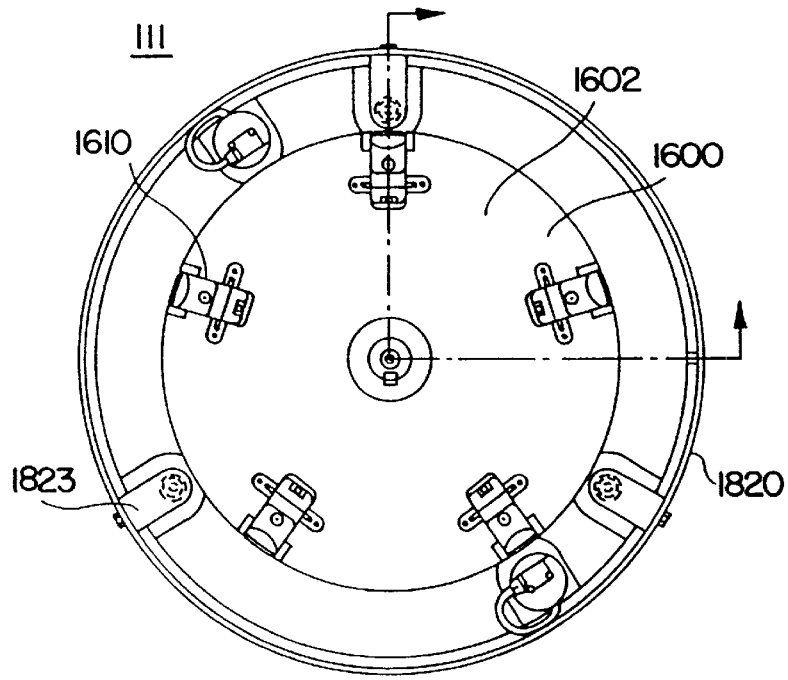
FIG. 17 is a top view of an exemplary spin support platform.

Shield assembly 1820 is preferably cylindrical in shape; spin platform 1600 is preferably round. As depicted in FIG. 17, shield assembly 1820 and spin platform 1600 may be substantially concentric, which facilitates effective protection for the surrounding workpieces and components of machine 100 and helps to reduce the size of machine 100.

In accordance with one aspect of the present invention, respective spin-dry assemblies 111 and 113 each include a motor (not shown) configured to rotate the spin platform 1600 and the workpiece carried thereby at high speed to thereby remove fluid from the workpiece. In accordance with a particularly preferred embodiment of the present invention, a substantially linear ramp is employed as opposed to the stepwise ramp techniques common in the prior art. For example, although the workpiece may be initially clamped in the spin assembly for a relatively low RPM (e.g., 200–1,000 RPM and most preferably about 500 RPM), the entire acceleration ramp is substantially linear from zero to the top operating speed. In a preferred embodiment, the spinning assembly is accelerated to in the range of 3,000–5,000 RPM, and most preferably about 4,000 RPM. Thus, in accordance with a particularly preferred embodiment, a substantially linear ramp is employed from approximately the rest position to 4,000 RPM.

In accordance with a further aspect of the present invention, the spin assembly 111, 113 is ramped from the point at which the workpiece is securely clamped to the spin platform (e.g., 500 RPM) to approximately 4,000 RPM in a range of 4–30 seconds, and most preferably about 6–8 seconds. Once top speed (e.g., 4,000 RPM) is achieved, it is maintained for in the range of 4–20 seconds, and most preferably about 10 seconds. Thereafter, a substantially linear ramp is employed to decelerate the spin assembly. In a preferred embodiment, deceleration is effected in approximately 4–30 seconds, and most preferably about 6–8 seconds.

In accordance with an alternate embodiment, the spin-dry assembly 111, 113 is suitably accelerated from the rest position to approximately the secondary clamping speed at a first acceleration, for example in the range of 20–1,000, and most preferably about 250–300 rpms/second/second. In the alternate embodiment, this original acceleration up to the secondary clamping speed suitably occurs in the range of 0.5–5 seconds, and most preferably in the range of about 1–2 seconds. Thereafter, once the workpiece is securely clamped by the spin assembly 111, 113, the assembly accelerates from clamping speed (e.g. 500 rpm) to top speed (e.g. 4,000 rpm) at a substantially linear (but suitably higher) acceleration. For example, the spin assembly may be accelerated from 500–4,000 rpm in the range of 0.5–10 seconds and most preferably in the range of about 1–2 seconds.

In accordance with a further aspect of the present invention, harmonics and resonant frequencies are substantially isolated from the workpiece to thereby minimize the possibility of workpiece breakage in the following manner.

The present inventors have determined that spin assembly performance can be greatly enhanced through the careful selection of an appropriate spinner motor. In a preferred embodiment of the present invention, a model number ASM 121 brushless servo motor, available from Berkeley Process Control, Inc. of Richmond, Calif., or a functionally equivalent motor may suitably be employed as the spinner motor. In accordance with one aspect of the present invention, the spinner motor comprises a self-tuning feature whereby the motor may be configured to automatically tune itself to optimize its performance within the anticipated operating environment within machine 100.

More particularly, the motor associated with each spin-dry assembly 111 and 113 may be pretuned by placing a sample workpiece in the spin-dry assembly, and placing the motor (not shown) in the auto-tune or self-tuning mode of operation. This is preferably done while machine 100 is fully operational, thereby optimally simulating the operating environment. The spin-dry assembly 111, 113 is then ramped-up in accordance with normal operating process parameters, and the motor is allowed to tune itself to the operating environment. In this regard, self-tuning motors generally define an operational profile within which the motor optimally operates in an intended operating environment by adjusting various parameters including current, frequency, torque, and the like. In so doing, harmonics and resonant frequencies which may otherwise be contributed to the spin-dry system by the motor are substantially eliminated.

In addition, many self-tuning motors have the capacity to store internally a range of operating parameters (i.e., the motor's optimum operating profile) for an intended environment. In accordance with a further aspect of the present invention, an output signal from the motor is suitably applied to the processor system associated with machine 100, so that as long as the motor operates within its predetermined, pretuned operating parameters, operation of the spin-dry station 110 remains uninterrupted. However, if the motor detects that it is approaching or operating outside of its predetermined profile (i.e., its pretuned range of operating parameters), machine 100 is suitably configured to receive an out-of-tune signal from the motor and display it to the operator. Upon receipt of an out-of-profile signal from the spinner motor, machine 100 may be configured to automatically cease operation; alternatively, the operator may suitably stop the machine and retune the spinner motor by placing the spinner motor back in its self-tune mode of operation and retuning the motor. In this way, damaged and broken workpieces as a result of the poor performance of the spinner motor may be substantially eliminated.

Referring again to FIGS. 1 and 2, transfer assembly 112 is suitably configured to alternatively retrieve dried workpieces from respective spin-dry assemblies 111 and 113. In particular, transfer assembly 112 suitably comprises an extendable, rotatable robotic arm 115 configured to grasp workpieces from each spin-dry assembly and load the workpieces into unload station 114.

More particularly and with continued reference to FIGS. 1 and 2, unload station 114 suitably comprises a first unload cassette assembly 117 and a second unload cassette assembly 119. In a preferred embodiment, transfer assembly 112 alternately retrieves dry workpieces from both spin-dry assemblies 111 and 113, and sequentially loads the workpieces into the cassette associated with unload assembly 119 until the cassette is filled. In this regard, a cassette full sensor (not shown) may be disposed within or proximate cassette unload assembly 119 to indicate that the cassette associated with assembly 119 is filled with dry workpieces. Once the cassette associated with assembly 119 is completely filled as indicated by the cassette full sensor, transfer station 112 continues retrieving dry workpieces from respective spin assemblies 111 and 113, and begins loading them into the cassette associated with unload cassette assembly 117. While cassette assembly 117 is being filled with dry wafers, the full cassette from assembly 119 may be removed (either manually or automatically) and replaced with an empty cassette. In this way, the unloading of dry cassettes from machine 100 may be accomplished in a substantially continuous, uninterrupted manner as desired.

In accordance with a further aspect of the present invention, as variously described above, during the operation of the machine 100 various fluids need to be supplied to the rinse rings (to both support the workpiece and rinse the workpiece), the water track, and to the roller box. Moreover, a plurality of different fluids (e.g., 3) may need to be supplied to the scrub box during the cleaning operation. In accordance with a further aspect of the present invention, machine 100 is suitably configured such that a desired volume rate of flow is supplied to these various operations, which flow rate is substantially unaffected by changes in fluid supply pressure, as described below.

Figure 21:
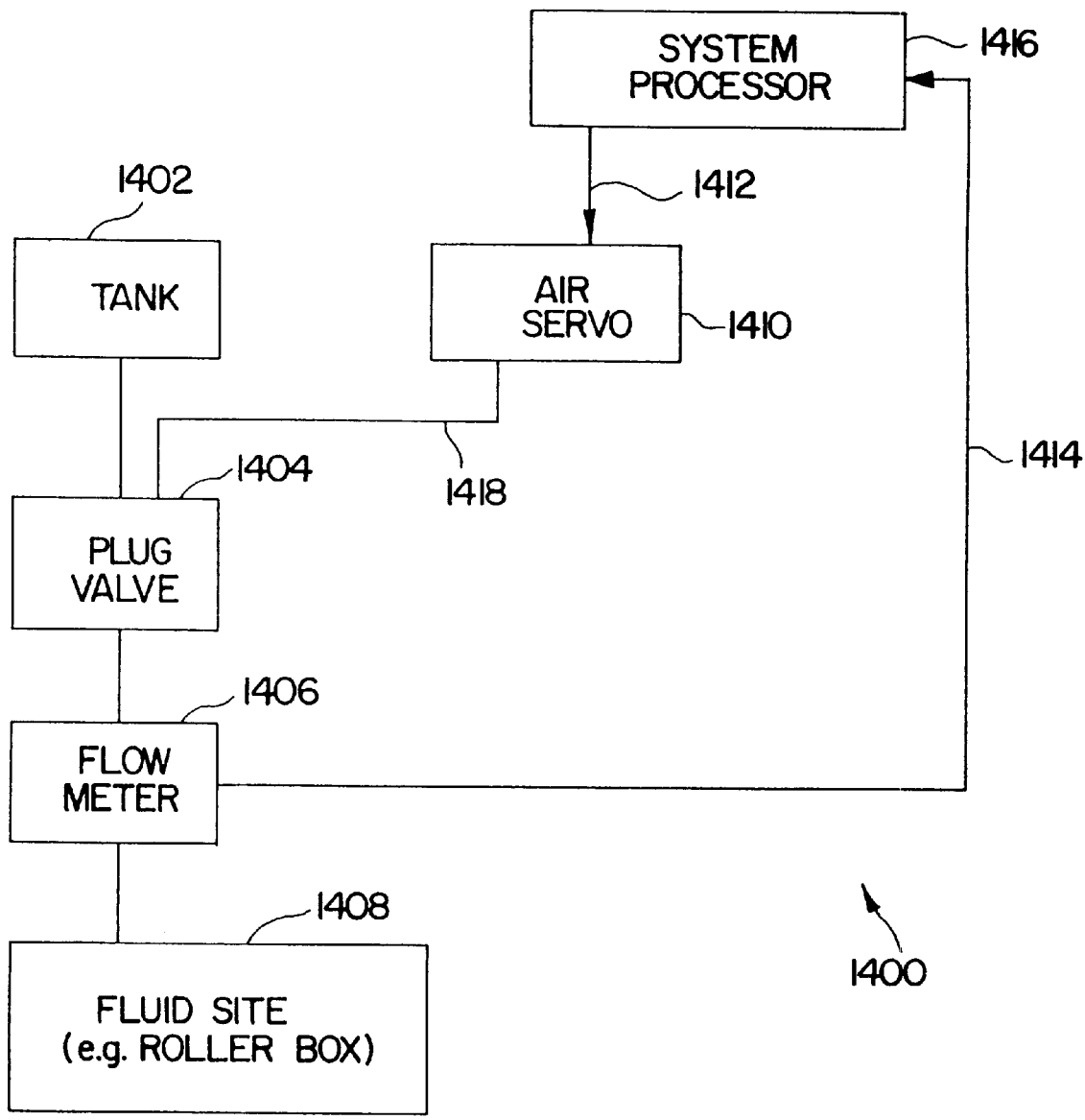
FIG. 21 is a block diagram of an exemplary fluid flow control system used in accordance with the present invention.

Referring now to FIG. 21, an exemplary fluid control scheme in accordance with one aspect of the present invention is illustrated. In particular, an exemplary fluid site 1408 may comprise rinse station 106, a fluid inlet port in cleaning station 104, or a workpiece rinse supply port, for example. Through the operation of the process controller (or one of several process controllers) 1416 associated with machine 100, the volume rate of fluid flow to fluid site 1408 may be accurately controlled notwithstanding the presence of variations in the fluid supply pressure.

With continued reference to FIG. 21, an exemplary hydraulic control scheme 1400 suitably comprises a tank 1402 for holding a supply of a desired processing fluid, a flow meter 1406 having a variable orifice size, a plug valve 1404 for controlling the orifice size of flow meter 1406, and an air servo 1410 for providing an analogue air signal to plug valve 1404, and a processor 1416. In accordance with one embodiment of the present invention, a suitable air servo may comprise a model number QB2T 1300 manufactured by Proportion-Air of McCordsville, Ind. under U.S. Pat. No. 4,901,758. In a preferred embodiment, servo valve 1410 suitably comprises a single loop model having internal valves, manifold, internal pressure transducer and electronic controls configured to output an air pressure proportional to an input electrical signal. In the illustrated embodiment, an electrical signal 1412 from processor 1416 suitably controls the output of servo 1410.

Also in accordance with a preferred embodiment of the present invention, flow meter 1406 may suitably comprise a rotary wheel flow meter/switch, for example, a model number M-10000T, M10000TM-200T, or the like available from the Malema Engineering Corporation.

With continued reference to FIG. 21, a desired flow rate through flow meter 1406 to fluid site 1408 is suitably programmed into processor 1416 prior to (or during) operation of machine 100. During operation, flow meter 1406 outputs an electrical signal 1414 indicative of the actual flow rate through flow meter 1406 to site 1408. Processor 1416 receives electrical signal 1414 and, responding thereto, adjusts the orifice size associated with flow meter 1406 as necessary to maintain the actual flow rate within a predetermined range from the desired set point flow rate.

More particularly, if the actual flow rate from flow meter 1406, as indicated by signal 1414, deviates from the set point by more than a predetermined error band, processor 1416 outputs an electrical signal 1412 to servo 1410 to thereby change the analogue air pressure signal 1418 output by air servo 1410 and applied to plug valve 1404. In response to analogue air signal 1418, plug valve 1404 changes the orifice size associated with flow meter 1406 in an amount necessary to drive the error between the actual flow rate and the desired flow rate through flow meter 1406 to a minimum. In accordance with a particularly preferred embodiment, a real time, closed loop PID control scheme is employed by processor 1416 to effect this function.

In accordance with an alternate embodiment of the present invention, air servo 1410 and plug valve 1404 could simply be eliminated, such that a direct actuation device may be employed to vary the orifice size of flow meter 1406. In this regard, any suitable torque motor, stepper motor, servo motor, or the like could be employed to directly control the orifice site associated with the flow meter.

In accordance with a further aspect of the present invention, wafer cleaning machine 100 may be advantageously configured in a substantially modular configuration to facilitate the convenient maintenance, repair, troubleshooting, adaptation, and extension of the machine.

Figure 22:
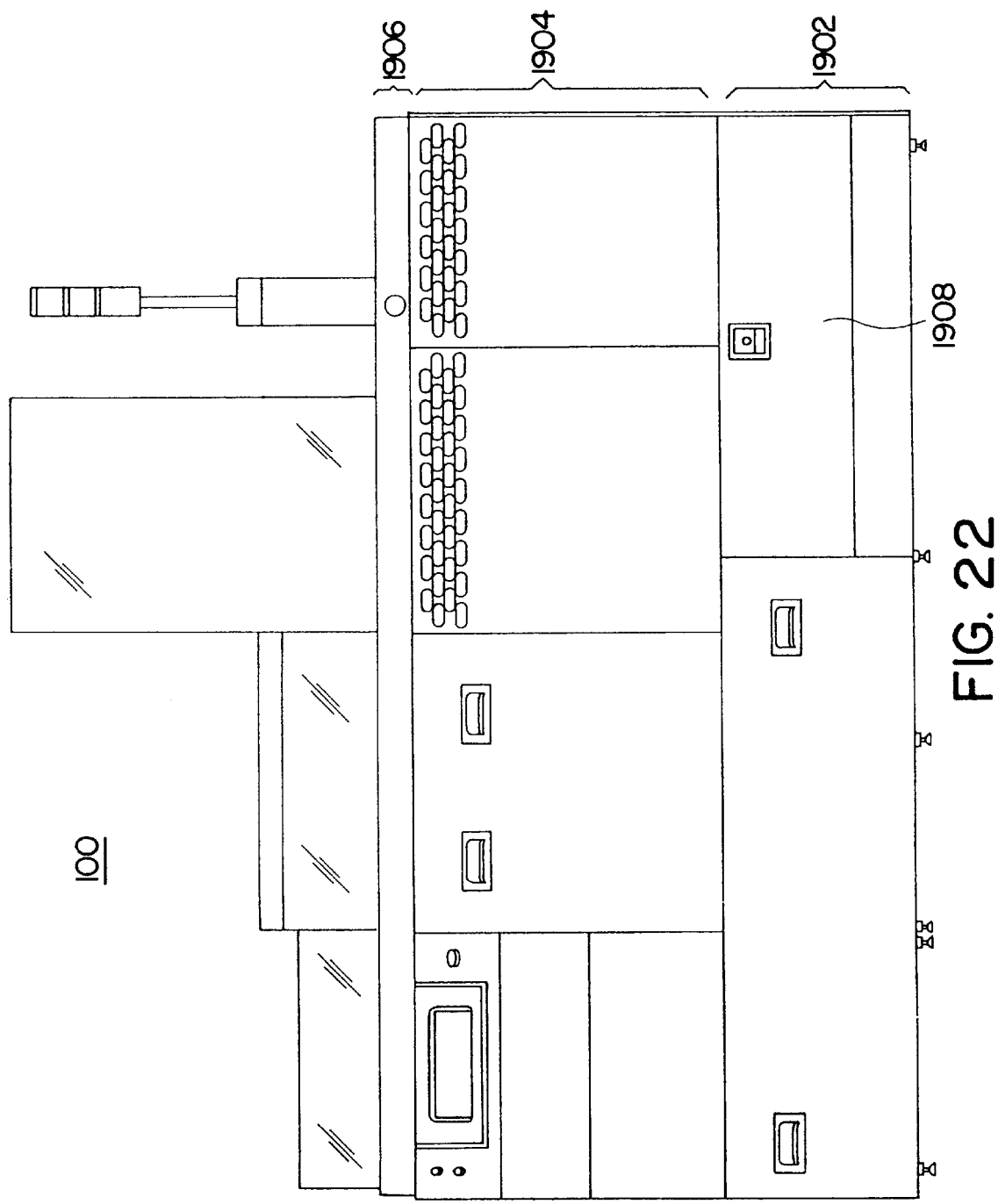
FIG. 22 is a front view of the machine shown in FIG. 1.

More particularly and referring to FIG. 22, in a preferred embodiment machine 100 suitably comprises a first control tier 1902, a second maintenance tier 1904, and a third process plane tier 1906. Top tier 1906 suitably corresponds to the workpiece processes described above, and advantageously comprises the various spin assemblies, rinse assemblies, scrubber box, and the like, as well as the various motors and actuators associated therewith. Maintenance tier 1904 suitably comprises a plurality of access panels (not shown for clarity) to permit convenient access to various daily and weekly maintenance items, including air filters, fluid filters, and the like. Control tier 1902 suitably houses various features relating to control functions, advantageously organized in discreet compartments each comprising functionally related hardware and related fixtures.

More particularly and with continued reference to FIG. 22, tier 1902 further comprises a number of drawers and/or skin panels which permit the operator to access various control and functional components. In particular, a first drawer 1908 suitably houses the control functionality relating to the electronics of the machine, including input-output ports and a distributed processor, for example one available from Berkly Process Control. A fluid compartment comprising fluid control valves and the like, and a pneumatics compartment comprising vacuum lines, pneumatic control valves and the like may be enclosed by at least one skin panel 1910.

By configuring machine 100 in accordance with the foregoing modular arrangement, maintenance and repair of machine 100 may be greatly simplified. For example, substantially all components which are logically related to one another may be housed in a common compartment, so that, for example, all fluids may be checked and fluid systems modified in a single location. As a further example, substantially all of the electronic controls and processing systems may be accessed at a single location (e.g., drawer 1908).

To further facilitate the convenient maintenance, repair, and extension of machine 100, drawers, such as drawer 1908, are suitably slidingly moveable with respect to the frame of machine 100, for example using ball bearing slide mechanisms functionally analogous to those used in file drawers. To facilitate the opening; closing, and removal of the drawers, the various electrical conduits associated with drawer 1908 and other conduits that may be associated with pneumatic or hydraulic control systems may be suitably encased in respective flexible conduit tracks (not shown) located within the frame of machine 100. In operation, an end of an exemplary flexible conduit may be suitably attached to the rear portion of drawer 1908. Thus, as drawer 1908 is opened, the flexible conduit moves along with the drawer. As the conduit slides along with drawer 1908, the various electrical conduits remain stationary and protected from damage by the conduit.

In accordance with a further aspect of the present invention, the modular construction of machine 100 facilitates the extension of the machine to incorporate additional related functionality or even different functionality entirely.

More particularly and referring now to FIG. 2, the various processing stations (e.g., wafer loading station 102, cleaning station 104) may be contained within separate subframe structures which together comprise the frame associated with machine 100. For example, a frame member 2102 associated with load station 102 is shown abutting against a frame member 2104 associated with cleaning station 104. Respective frame members 2102 and 2104 may be secured to one another, for example through bolts or other fasteners, as desired. If it is desired to augment machine 100 to include an additional module, for example an additional scrubber box, an additional cassette assembly, or perhaps a module relating to entirely different functionality (e.g., planarization, lapping, or the like), respective stations 102 and 104 may be separated at the junction 2106 which defines their interface, and an additional functional module inserted therebetween. The newly inserted functional module may also include a first, second, and third tier component which respectively house the processing, maintenance, and control functionality of the additional module, as desired.

In accordance with a further aspect of the present invention, a touch screen display (not shown) may suitably be employed to allow the operator to monitor, reconfigure, troubleshoot, and otherwise operate machine 100. More particularly, a touch screen display panel may be configured to display, preferably in three dimensions, a graphical representation of the various operational features of machine 100 described above. For example, if the operator desires to load a new cassette into load station 102, the operator may press a graphical icon representative of load station 102 on the touch screen display. The touch screen display may then prompt the operator with questions, or may simply permit the operator to touch the door associated with the cassette loading function to thereby open the door. This model of touch screen interaction may be applied to virtually any aspect of machine 100 described herein.

Although the present invention has been described in conjunction with appended drawing figures, it will be appreciated that the invention is not so limited. Various additions, deletions, substitutions, and rearrangement of parts and processing steps may be made in the design and implementation of the subject cleaning system without departing from the spirit and scope of the subject invention, as set forth more particularly in the appended claims.

What is claimed is:

1. A rinse station for use with a system for cleaning, rinsing, and drying semiconductor wafer workpieces, said rinse station comprising:

a lower portion and an upper portion positioned above said lower portion, said upper and lower portions defining a rinse area therebetween;

an entry passage configured to receive a workpiece, said entry passage being located between said upper and lower portions and proximate an edge of at least one of said upper and lower portions;

a first plurality of fluid jets formed within said upper portion and configured to discharge fluid proximate said rinse area;

a second plurality of fluid jets formed within said lower portion and configured to discharge fluid proximate said rinse area; and a support stand assembly coupled to said lower portion, said support stand assembly having an actuator mechanism configured to tilt said upper and lower portions during rinsing to facilitate drainage of fluid from said rinse area.

2. A rinse station according to claim 1, wherein said first plurality of fluid jets include a number of initial rinsing jets located proximate said entry passage, said initial rinsing jets being configured to dispense fluid to said workpiece before said workpiece is received into said rinse area.

3. A rinse station according to claim 1, wherein said second plurality of fluid jets are configured such that fluid ejected therefrom supports said workpiece above an upper surface of said lower portion.

4. An apparatus for use with a system for cleaning, rinsing, and drying semiconductor wafer workpieces, said apparatus comprising:

a rinse station configured to rinse a workpiece during a rinsing process, said rinse station having:

a lower portion and an upper portion positioned above said lower portion, said upper and lower portions defining a rinse area therebetween; and a plurality of fluid jets formed within said upper and lower portions and configured to discharge fluid proximate said rinse area during said rinsing process; and a manipulator configured to remove a rinsed workpiece from said rinse station, said manipulator having:

a base, a swing arm having a free end and an axis end coupled to said base such that said swing arm is capable of rotation about a substantially vertical axis of rotation; and a transport section located proximate said free end; wherein said lower portion of said rinse station includes means for receiving a portion of said transport section, and said transport section is configured to engage said means for receiving during removal of said workpiece from said rinse station.

5. An apparatus according to claim 4, wherein said means for receiving comprises a recess formed within said lower portion, said recess being located within said rinse area.

6. An apparatus according to claim 5, wherein said portion of said transport section is configured to fit within said recess and beneath said workpiece when said workpiece is positioned within said rinse area.

7. An apparatus according to claim 6, wherein said manipulator causes said swing arm to lift when said transport section is beneath said workpiece to facilitate removal of said workpiece from said rinse station.

8. An apparatus according to claim 5, wherein said recess and said transport section are arcuate-shaped.

9. An apparatus according to claim 4, further comprising means for securing a workpiece onto said transport section, said means for securing being active when said transport section removes said workpiece from said rinse station.

10. An apparatus according to claim 4, wherein said rinse station is configured to tilt during rinsing to facilitate drainage of rinse fluid from said rinse area and to return said workpiece to a substantially horizontal position to facilitate removal of said workpiece from said rinse station by said manipulator.

11. An apparatus according to claim 4, wherein said swing arm is configured to pass between said upper and lower portions of said rinse station during removal of said workpiece.

12. A rinse station for use with a system for cleaning, rinsing, and drying semiconductor wafer workpieces, said rinse station comprising:

a lower portion and an upper portion positioned above said lower portion, said upper and lower portions defining a rinse area therebetween;

an entry passage configured to receive a workpiece, said entry passage being located between said upper and lower portions and proximate an edge of at least one of said upper and lower portions;

a first plurality of fluid jets formed within said upper portion and configured to discharge fluid proximate said rinse area, said first plurality of fluid jets being configured such that fluid ejected therefrom urges said workpiece from said entry passage to said rinse area; and a second plurality of fluid jets formed within said lower portion and configured to discharge fluid proximate said rinse area.

13. A rinse station according to claim 12, wherein said first plurality of fluid jets include a number of initial rinsing jets located proximate said entry passage, said initial rinsing jets being configured to dispense fluid to said workpiece before said workpiece is received into said rinse area.

14. A rinse station according to claim 12, wherein said second plurality of fluid jets are configured such that fluid ejected therefrom supports said workpiece above an upper surface of said lower portion.

15. A rinse station according to claim 12, wherein said first plurality of fluid jets are inclined at an angle in the range of 20 to 70 degrees relative to a plane substantially defined by an upper surface of said lower portion.

16. A rinse station for use with a system for cleaning, rinsing, and drying semiconductor wafer workpieces, said rinse station comprising:

a lower portion and an upper portion positioned above said lower portion, said upper and lower portions defining a rinse area therebetween;

an entry passage configured to receive a workpiece, said entry passage being located between said upper and lower portions and proximate an edge of at least one of said upper and lower portions;

a first plurality of fluid jets formed within said upper portion and configured to discharge fluid proximate said rinse area;

a second plurality of fluid jets formed within said lower portion and configured to discharge fluid proximate said rinse area; and a recess formed within said lower portion, said recess being located beneath said workpiece when said workpiece is in a rinsing position within said rinse area, wherein said recess is configured to receive a workpiece transport arm for removing said workpiece from said rinse station.

17. A rinse station according to claim 16, wherein said recess is arcuate-shaped to facilitate cooperation with an arcuate-shaped workpiece transport arm.

18. A rinse station according to claim 16, wherein said first plurality of fluid jets include a number of initial rinsing jets located proximate said entry passage, said initial rinsing jets being configured to dispense fluid to said workpiece before said workpiece is received into said rinse area.

19. A rinse station according to claim 16, wherein said second plurality of fluid jets are configured such that fluid ejected therefrom supports said workpiece above an upper surface of said lower portion.

* * * * *